US008100170B2

(12) United States Patent
Huang et al.

(10) Patent No.: US 8,100,170 B2
(45) Date of Patent: Jan. 24, 2012

(54) EVAPORATOR, LOOP HEAT PIPE MODULE AND HEAT GENERATING APPARATUS

(75) Inventors: Bin-Juine Huang, Taipei (TW); Huan-Hsiang Huang, Taipei (TW); Fu-Sheng Sun, Taipei County (TW); Yi-Hai Lian, Taichung (TW)

(73) Assignee: Advanced Thermal Device Inc., Taipei (TW)

( * ) Notice: Subject to any disclaimer, the term of this patent is extended or adjusted under 35 U.S.C. 154(b) by 1210 days.

(21) Appl. No.: 11/831,973

(22) Filed: Aug. 1, 2007

(65) Prior Publication Data

US 2009/0032226 A1 Feb. 5, 2009

(51) Int. Cl.
*H05K 7/20* (2006.01)

(52) U.S. Cl. .................................. 165/104.26; 361/700

(58) Field of Classification Search ............. 165/104.26, 165/104.33; 361/700
See application file for complete search history.

(56) References Cited

U.S. PATENT DOCUMENTS

| | | | | |
|---|---|---|---|---|
| 4,602,679 | A * | 7/1986 | Edelstein et al. | 165/104.26 |
| 4,770,238 | A * | 9/1988 | Owen | 165/104.26 |
| 5,465,782 | A * | 11/1995 | Sun et al. | 165/104.26 |
| 5,761,037 | A * | 6/1998 | Anderson et al. | 361/700 |
| 6,437,981 | B1 * | 8/2002 | Newton et al. | 361/700 |
| 6,910,794 | B2 | 6/2005 | Rice | |
| 7,143,818 | B2 * | 12/2006 | Thayer et al. | 165/104.26 |
| 2003/0159809 | A1 * | 8/2003 | Valenzuela | 165/104.26 |
| 2005/0092469 | A1 * | 5/2005 | Huang | 165/126 |
| 2005/0183847 | A1 * | 8/2005 | Wong | 165/104.33 |
| 2005/0213303 | A1 * | 9/2005 | Tonosaki et al. | 361/700 |
| 2007/0267180 | A1 * | 11/2007 | Asfia et al. | 165/104.26 |

* cited by examiner

*Primary Examiner* — Allen Flanigan
(74) *Attorney, Agent, or Firm* — Jianq Chyun IP Office

(57) ABSTRACT

An evaporator suitable for absorbing heat from a heat source is provided. The evaporator includes a top board, a bottom board, a side frame, and at least one porous member. The side frame connects the top board and the bottom board. The porous member is disposed between the top board and the bottom board and within the side frame. The part of the top board covering the porous member is a heat conducting portion near the heat source. The evaporator has at least one first channel, at least one second channel, a fluid inlet, and a fluid outlet. The first channel is adjacent to the bottom board and the porous member for containing a working fluid. The second channel is adjacent to the top board and the porous member for containing the working fluid. The fluid inlet communicates with the first channel. The fluid outlet communicates with the second channel.

59 Claims, 27 Drawing Sheets

EVAPORATOR, LOOP HEAT PIPE MODULE AND HEAT GENERATING APPARATUS

BACKGROUND OF THE INVENTION

1. Field of the Invention

The present invention relates to a heat transfer apparatus. More particularly, the present invention relates to a loop heat pipe module and an evaporator thereof.

2. Description of Related Art

With the development of modern science and technology, light emitting diodes (LEDs) have been used as new illumination devices. As a large quantity of heat will be generated during the operation of the LEDs, and the luminance and reliability of the LEDs will be influenced apparently when the operating temperature is too high, the heat generated by the LEDs must be dissipated rapidly. In addition, with the innovation of semiconductor process technology, effective transistors in a unit area or volume of various chips increases gradually, which results in a dramatic increase of the generated heat despite of the improvement of the overall efficiency of the chips. When the operating temperature is too high, the stability and service life of the chips will be influenced. Therefore, the heat generated by the chips must be dissipated rapidly as well.

Referring to FIG. 1, in order to solve the problem of heat dissipation, U.S. Pat. No. 6,910,794 has disclosed a heat pipe 100 for dissipating heat. The heat pipe 100 includes a shell 110 and a porous member 120 disposed in the shell 110, and has an evaporation area 130 and a condensation area 140 disposed opposite to the evaporation area 130. The evaporation area 130 is adjacent to a carrier board 50, and a plurality of LEDs 60 is disposed on the carrier board 50. Volatile liquid is contained in the porous member 120. The heat generated by the LEDs 60 is conducted to the volatile liquid in the evaporation area 130 through the carrier board 50 and the porous member 120, so that the volatile liquid evaporates to become vapor. The vapor is then transmitted towards the condensation area 140, and passes through the porous member 120 to be dissipated into a gap 150 between the porous member 120 and the shell 110. The heat carried by the vapor in the gap 150 is dissipated to the environment, such that the vapor is condensed into the volatile liquid. Then, the condensed volatile liquid flows back to the evaporation area 130.

As the transmission distance and transmission direction of the volatile liquid in the heat pipe 100 are limited by the length and shape of the heat pipe 100, such a heat dissipation design cannot be applied to machines with various shapes, that is to say, the design flexibility is poor. Moreover, when the heat pipe 100 is placed vertically to make the condensation area 140 facing downward, the volatile liquid in the porous member 120 is concentrated in the condensation area 140 under the gravity, so the volatile liquid in the evaporation area 130 will decrease greatly, making the heat pipe unable to function normally and effectively.

SUMMARY OF THE INVENTION

The present invention is directed to providing an evaporator in a shape that is suitable to be combined with a heat source and occupies less space.

The present invention is also directed to providing a loop heat pipe module, which has a longer heat transfer distance, and the heat transfer path can be changed for different requirements without being influenced by the gravity.

The present invention is further directed to a heat generating apparatus having a better heat dissipating characteristic.

The present invention provides an evaporator suitable for absorbing heat from a heat source. The evaporator includes a top board, a bottom board, a side frame, and at least one porous member. The side frame connects the top board and the bottom board. The porous member is disposed between the top board and the bottom board and within the side frame. The part of the top board covering the porous member is a heat conducting portion near the heat source. The evaporator has at least one first channel, at least one second channel, at least one fluid inlet, and at least one fluid outlet. The first channel is adjacent to the bottom board and the porous member for containing a working fluid. The second channel is adjacent to the top board and the porous member for containing the working fluid. The porous member is suitable for transferring the working fluid from the first channel to the second channel. The fluid inlet communicates with the first channel. The fluid outlet communicates with the second channel.

A loop heat pipe module including the aforementioned evaporator, a condenser, at least one first fluid transmission pipe, and at least one second fluid transmission pipe is also provided. The condenser is suitable for containing the working fluid, and has at least one fluid inlet and at least one fluid outlet. The first fluid transmission pipe connects the fluid outlet of the evaporator and the fluid inlet of the condenser. The second fluid transmission pipe connects the fluid outlet of the condenser and the fluid inlet of the evaporator.

A heat generating apparatus including a heat generating unit, a heat dissipating unit, and the aforementioned loop heat pipe module is further provided. The evaporator of the loop heat pipe module is suitable for absorbing heat of the heat generating unit, and the heat conducting portion of the evaporator is connected with the heat generating unit. The condenser is connected with the heat dissipating unit.

In one embodiment of the present invention, the heat generating unit may include a carrier and at least one light emitting device. The carrier is connected with the heat conducting portion of the top board. The light emitting device is disposed on the carrier, and the light emitting device may include an LED.

In one embodiment of the present invention, at least a part of the condenser may extend in a curved shape along a surface of the heat dissipating unit. The heat dissipating unit is, for example, a housing, and at least a part of the condenser may extend in a curved shape along an inner surface and/or an outer surface of the housing.

Hereinafter, embodiments applicable to the evaporator, the loop heat pipe module, and the heat generating apparatus mentioned above are described as follows.

In one embodiment of the present invention, the porous member can have a first surface and a second surface. The first surface faces the bottom board, and can have at least one groove to form the first channel. The second surface faces the top board, and can have at least one groove to form the second channel.

In one embodiment of the present invention, the evaporator can further include a heat insulation board disposed between the top board and the bottom board, so as to partition the first channel and the second channel.

In one embodiment of the present invention, the heat insulation board can have at least one opening, and the porous member passes through the opening.

In one embodiment of the present invention, edge of the heat insulation board can have at least one chip, and a part of the porous member passes through the chip.

In one embodiment of the present invention, the heat insulation board can have at least one cavity.

In one embodiment of the present invention, the evaporator can further include at least one first support unit and at least one second support unit. The first support unit connects the bottom board and the heat insulation board. The second support unit connects the top board and the heat insulation board.

In one embodiment of the present invention, the evaporator can further include a plurality of first partition units and a plurality of second partition units. The first partition units are disposed on the bottom board and within the side frame. The second partition units are disposed on the top board and within the side frame. The number of each of the porous members, the first channels, and the second channels can be more than one. The first partition units and the second partition units partition the porous members. The second partition units, the porous members and the bottom board define the first channels, and the first partition units, the porous members and the top board define the second channels.

In one embodiment of the present invention, the evaporator can further have a compensation chamber located between the porous member and the side frame for containing the working fluid, wherein the fluid inlet of the evaporator communicates with the first channel through the compensation chamber. The evaporator can further include a support frame disposed among the top board, the bottom board, and the side frame, so as to partition the compensation chamber, the first channel, and the second channel. The evaporator can further have at least one filling opening, communicating with the compensation chamber.

In one embodiment of the present invention, the evaporator can further have a fluid collecting chamber located between the porous member and the side frame. The fluid collecting chamber communicates with the fluid outlet of the evaporator and the second channel. The working fluid in the second channel is collected into the fluid collecting chamber, and is output through the fluid outlet of the evaporator.

In one embodiment of the present invention, the top board can have at least one accommodation groove for accommodating the porous member. The second channel can be located between the top board and the porous member, and the first channel can be located at one side of the porous member.

In one embodiment of the present invention, the bottom board can have at least one accommodation groove, for accommodating the porous member. The first channel can be located between the bottom board and the porous member. The second channel can be located at one side of the porous member.

In one embodiment of the present invention, each of the top board and the bottom board can have at least one accommodation groove, for accommodating the porous member. The first channel can be located between the bottom board and the porous member. The second channel can be located between the top board and the porous member.

In one embodiment of the present invention, the evaporator can further include at least one support unit connecting the top board and the bottom board.

In one embodiment of the present invention, the side frame and the top board can be integrally formed, or the side frame and the bottom board can be integrally formed.

In one embodiment of the present invention, the working fluid can include water, acetone, aqua ammonia, refrigerant, nano fluid, or a combination thereof.

In one embodiment of the present invention, the evaporator further has at least one filling opening, communicating with the first channel.

The evaporator of the present invention can be in a shape of a flat plate. The shape is suitable for combining the evaporator with the heat source and occupies less space, and helps to improve the heat transfer efficiency, so as to improve the heat transfer efficiency of the loop heat pipe module of the present invention. In the loop heat pipe module of the present invention, as the shapes and lengths of the first fluid transmission pipe and the second fluid transmission pipe connecting the evaporator and the condenser can be changed as required, the relative positions and the distance between the evaporator and the condenser can be changed as required as well. Thus, the heat transfer distance of the loop heat pipe module can be longer, and the heat transfer path can be changed as required without being influenced by the gravity, so as to improve the heat dissipation characteristics of the heat generating apparatus of the present invention.

In order to make the aforementioned and other objects, features and advantages of the present invention comprehensible, preferred embodiments accompanied with figures are described in detail below.

DESCRIPTION OF EMBODIMENTS

Figure 1:
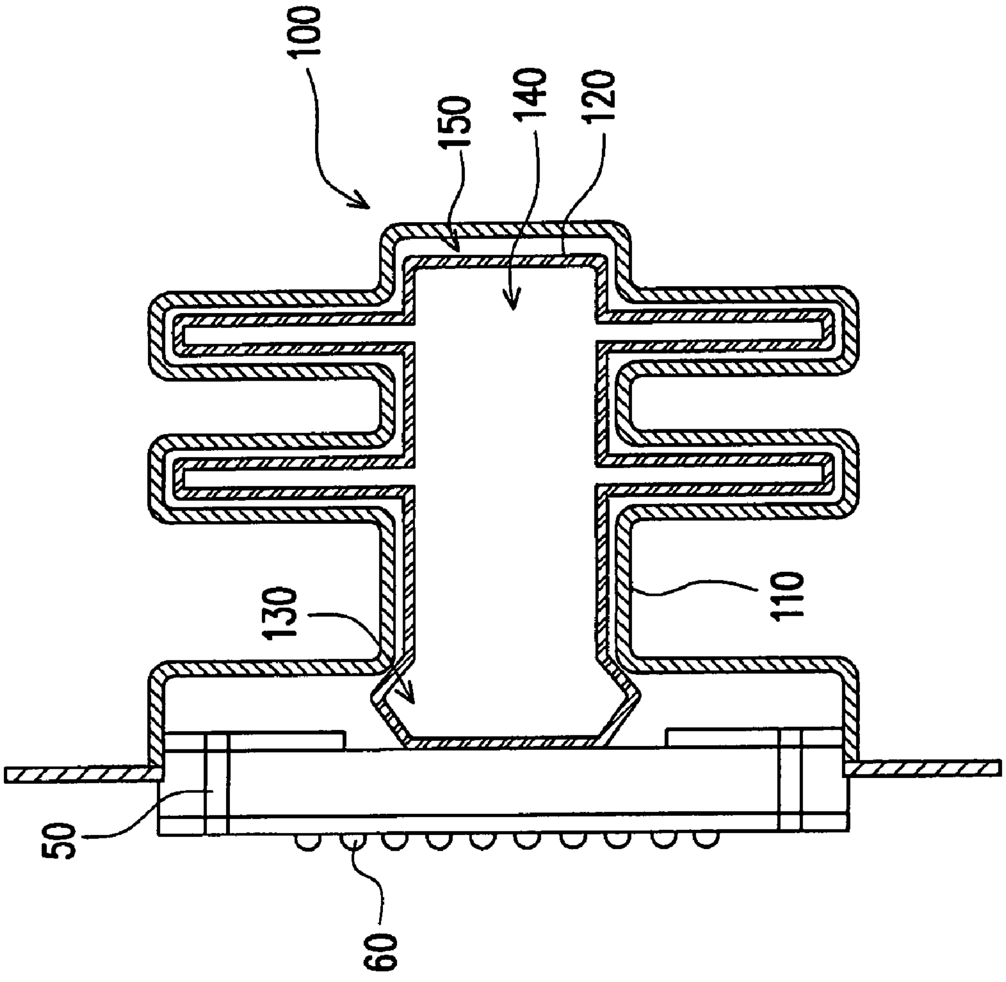
FIG. 1 (PRIOR ART)
FIG. 1 is a sectional view of a conventional heat pipe.
Figure 2A:
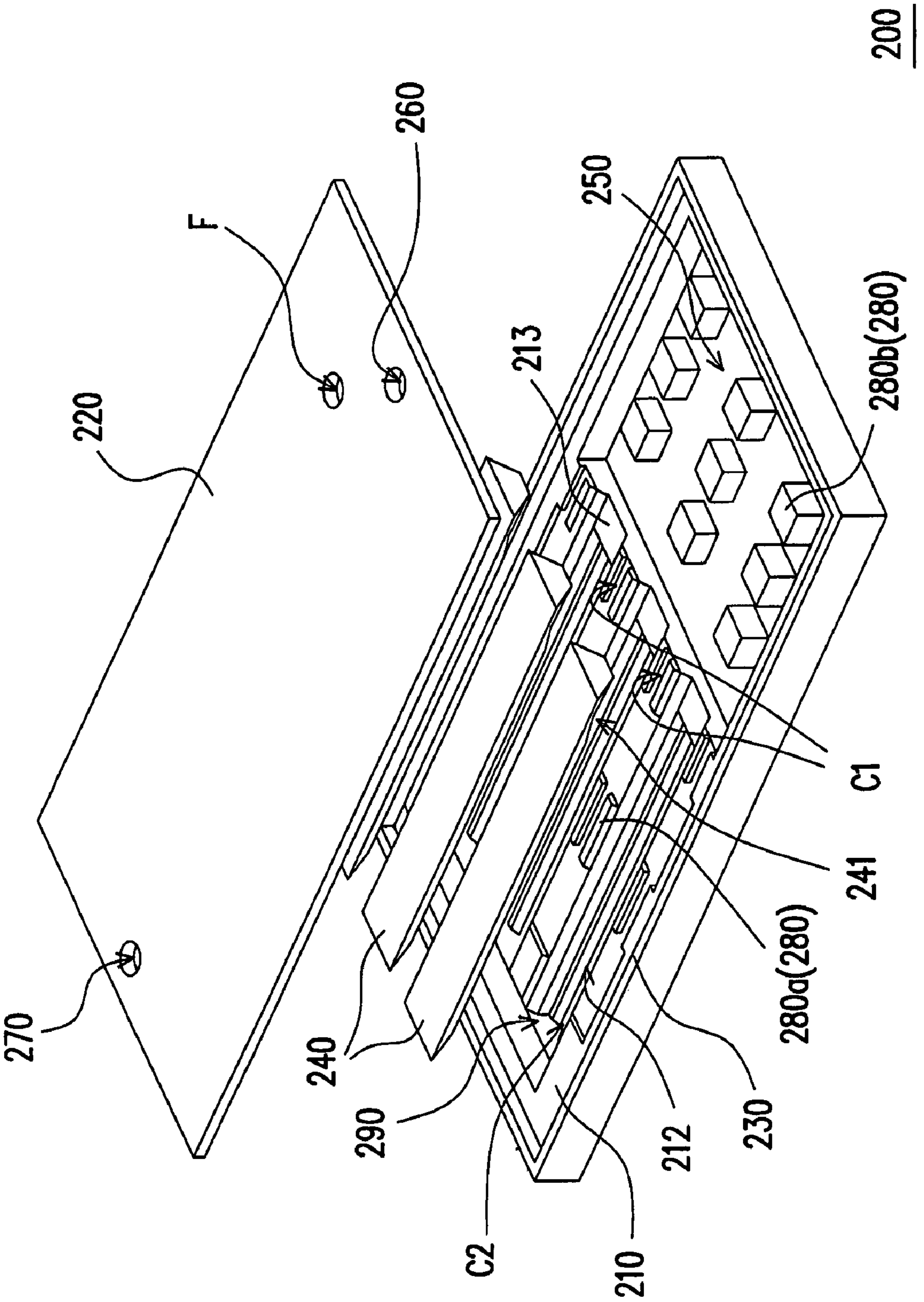
FIG. 2A is an exploded view of the evaporator according to an embodiment of the present invention.
Figure 2B:
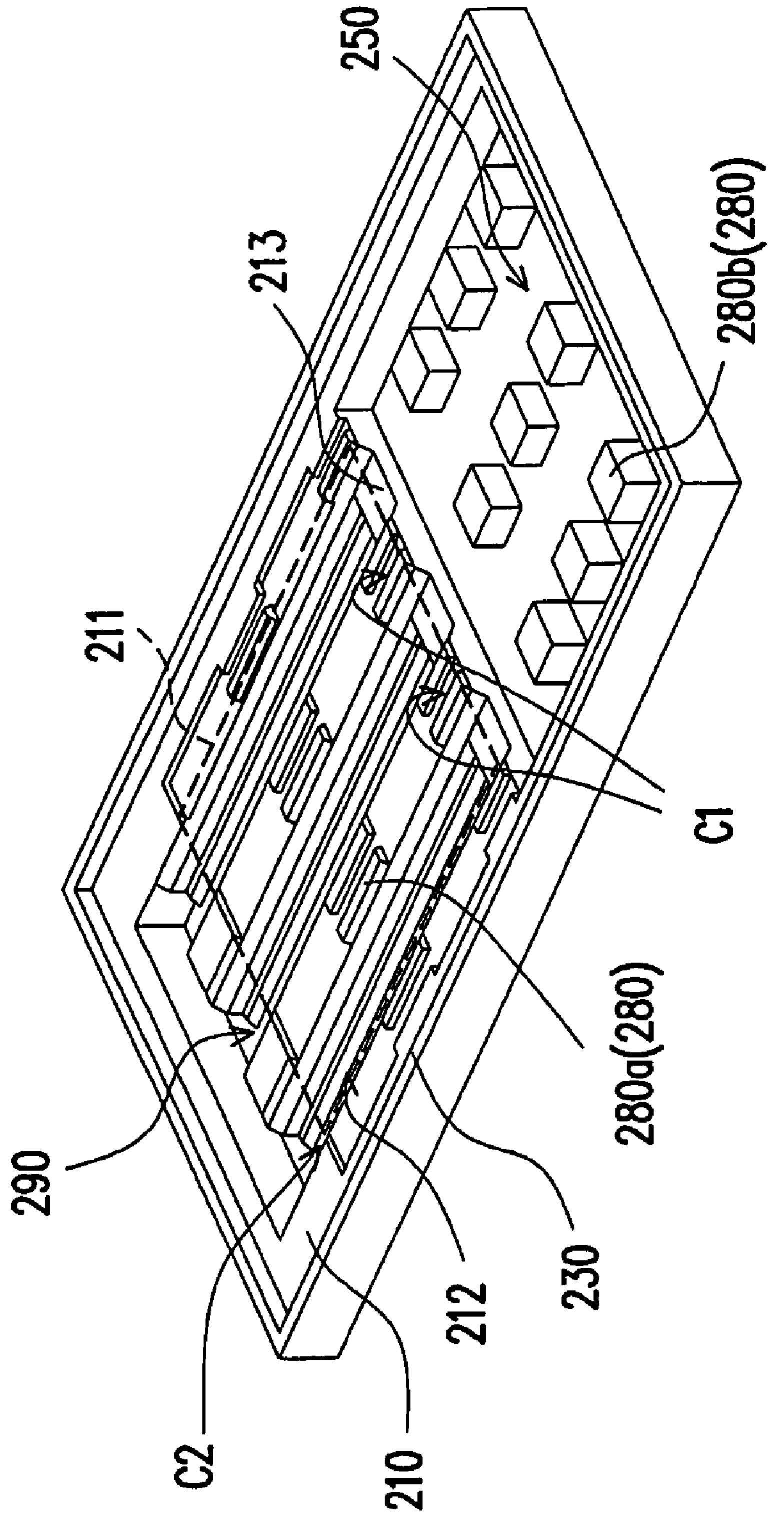
FIG. 2B is a schematic structural view of the top board of FIG. 2A.
Figure 2D:
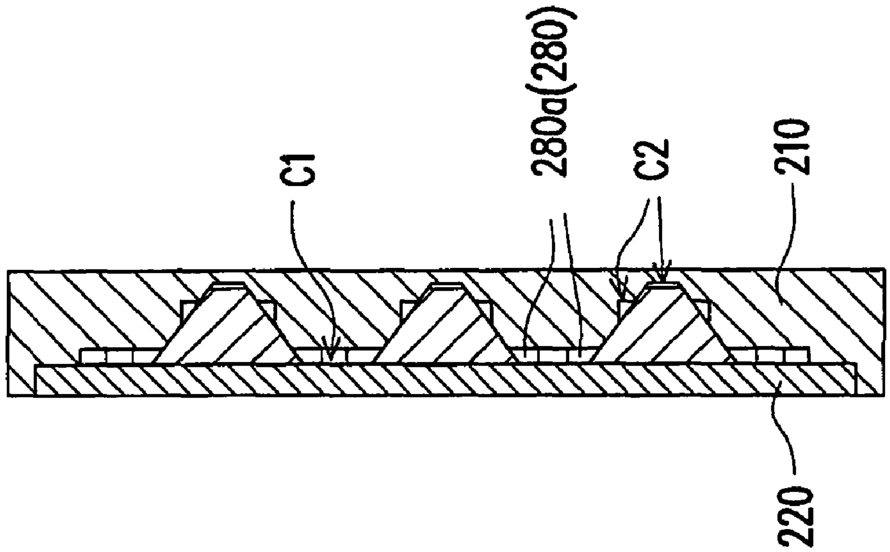
FIG. 2D is a sectional view taken along a section line A-A in FIG. 2C.
Figure 2C:
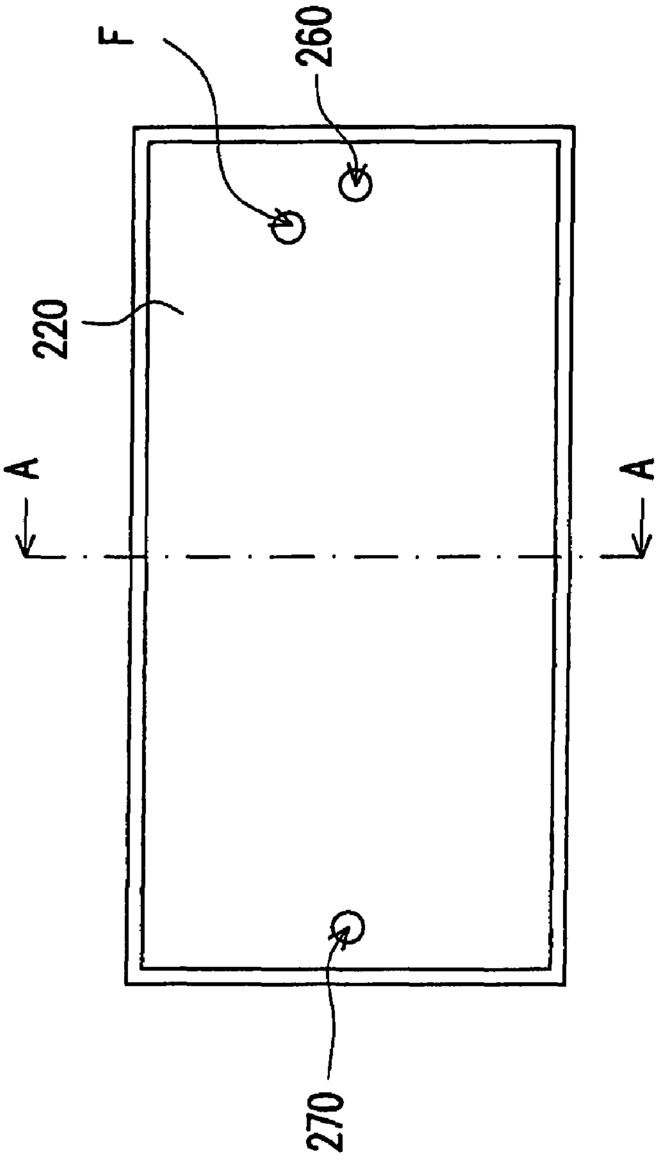
FIG. 2C is a front view of the evaporator of FIG. 2A.
Figure 2E:
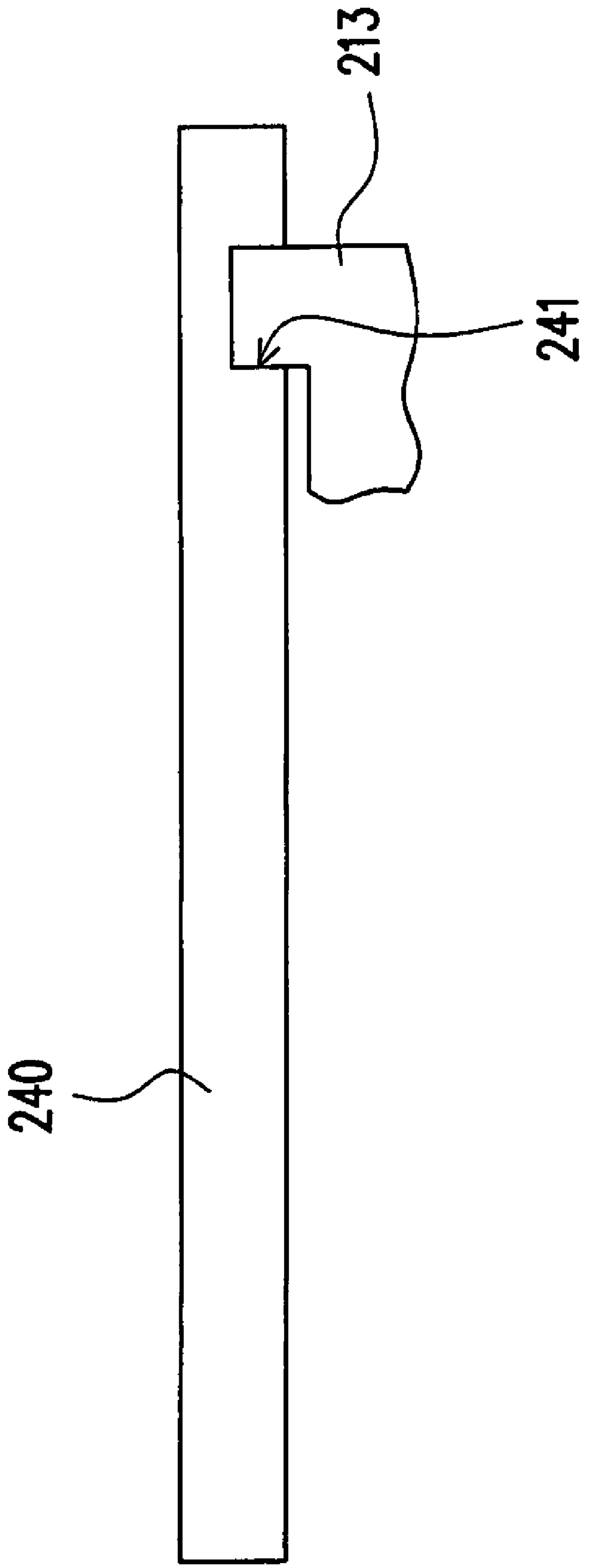
FIG. 2E is a sectional view of the porous member of FIG. 2A.

FIG. 2A is an exploded view of the evaporator according to an embodiment of the present invention. FIG. 2B is a schematic structural view of the top board of FIG. 2A. FIG. 2C is a front view of the evaporator of FIG. 2A. FIG. 2D is a sectional view taken along a section line A-A in FIG. 2C. FIG. 2E is a sectional view of the porous member of FIG. 2A. Referring to FIGS. 2A-2E, the evaporator 200 of this embodiment is suitable for absorbing heat generated by a heat source. The evaporator 200 includes a top board 210, a bottom board 220, a side frame 230, and at least one porous member 240. The material of the top board 210, the bottom board 220 and the side frame 230 is, for example, metal, ceramic or other suitable heat conductive materials. The side frame 230 connects the top board 210 and the bottom board 220. In this embodiment, the side frame 230 and the top board 210 can be integrally formed. However, in other embodiments, the side frame can be integrally formed with the bottom board, or the side frame, the top board, and the bottom board are a combination of independent structures. The porous member 240 is disposed between the top board 210 and the bottom board 220 and within the side frame 230. In this embodiment, the porous member 240 may connect the top board 210 and the bottom board 220. The part of the top board 210 covering the porous member 240 is a heat conducting portion 211 close to a heat source.

The evaporator 200 has at least one first channel C1, at least one second channel C2, at least one fluid inlet 260, and at least one fluid outlet 270. The first channel C1 is adjacent to the bottom board 220 and the porous member 240 for containing a working fluid. The working fluid is, for example, water, acetone, ammonia, refrigerant, nano fluid, other volatile fluids, or any combination of the above fluids. The second channel C2 is adjacent to the top board 210 and the porous member 240. The porous member 240 is suitable for transferring the working fluid from the first channel C1 to the second channel C2. In this embodiment, the porous member 240 may absorb the working fluid flowing in the first channel C1, so as to transfer the working fluid from the first channel C1 to the second channel C2. The fluid inlet 260 communicates with the first channel C1, and the fluid outlet 270 communicates with the second channel C2. In this embodiment, the evaporator 200 may further have a compensation chamber 250 located between the porous member 240 and the side frame 230 for containing the working fluid, wherein the fluid inlet 260 communicates with the first channel C1 through the compensation chamber 250. More specifically, the compensation chamber 250 can be disposed at one side of the porous member 240. However, in other embodiments, the compensation chamber 250 can also surround the porous member 240. In this embodiment, the fluid inlet 260 and the fluid outlet 270 can be disposed at the bottom board 220. However, in other embodiments, the fluid inlet can be disposed at the top board or the side frame, and the fluid outlet can also be disposed at the top board or the side frame.

In this embodiment, the top board 210 can have at least one accommodation groove 212 for accommodating the porous member 240. The second channel C2 can be disposed between the top board 210 and the porous member 240, and the first channel C1 can be disposed at one side of the porous member 240. However, in other embodiments, the bottom board can have at least one accommodation groove, the first channel can be located between the bottom board and the porous member, and the second channel can be located at one side of the porous member. In addition, in other embodiments, each of the top board and the bottom board can also have at least one accommodation groove, the first channel can be located between the bottom-board and the porous member, and the second channel can be located between the top board and the porous member.

The evaporator 200 may further have at least one filling opening F, communicating with the first channel C1. The working fluid can be filled into the evaporator 200 through the filling opening F when the evaporator 200 is manufactured or repaired. In this embodiment, the filling opening F may communicate with the compensation chamber 250. In other words, the filling opening F may communicate with the first channel C1 through the compensation chamber 250. In this embodiment, the filling opening F may be located on the bottom board 220. However, in other embodiments, the filling opening may also be located on the top board or the side frame.

In this embodiment, the evaporator 200 can further include at least one support unit 280 connecting the top board 210 and the bottom board 220, so as to prevent the top board 210 and the bottom board 220 from being expanded outward as the evaporator 200 is heated. In specific, the support unit 280 may include a support unit 280*a* and a support unit 280*b*. The support unit 280*a* is connected with the heat conducting portion 211, and the support unit 280*b* is disposed in the compensation chamber 250. However, in other embodiments, the evaporator can also include one of the support unit 280*a* and the support unit 280*b*. In this embodiment, the support unit 280 and the top board 210 can be integrally formed. However, in other embodiments, the support unit can be integrally formed with the bottom board, or the top board, the bottom board, and the support unit are a combination of independent structures. Moreover, the material of the support unit 280 is, for example, metal, ceramic, or other materials suitable for support.

When the heat conducting portion 211 receives the heat from the heat source, the heat is conducted to the working fluid in the second channel C2 through the heat conducting portion 211 and the porous member 240, and the working fluid will evaporate to change from liquid to gas state after absorbing the heat. Then, the porous member 240 transfers the working fluid from the first channel C1 to the second channel C2 based on capillarity phenomenon. The second channel C2 can allow the working fluid in gas state to flow therein, and to be output from the fluid outlet 270. The working fluid in liquid state can flow from the fluid inlet 260 into the compensation chamber 250, and then flows into the first channel C1, so as to supplement the working fluid in liquid state in the first channel C1.

A normal conventional evaporator is often in a cylindrical shape, and normally must be embedded into a heat conducting block to be easily combined with the heat source. However, the evaporator 200 in this embodiment can be in a shape of a flat plate, which enables the evaporator 200 to be combined with the heat source directly and to occupy less space. Furthermore, as the outer surface area of the heat conducting portion 211 is large, the contact area between the heat conducting portion 211 and the heat source can be relatively large, thereby effectively improving the heat transfer efficiency of the evaporator 200.

In this embodiment, the evaporator 200 can further have a fluid collecting chamber 290 disposed between the porous member 240 and the side frame 230. The fluid collecting chamber 290 communicates with the fluid outlet 270 and the second channel C2. The working fluid in the second channel C2 is collected in the fluid collecting chamber 290, and is output through the fluid outlet 270. In addition, at least one tenon 213 can be disposed on the heat conducting portion 211 at a position near the compensation chamber 250, and the porous member 240 can have a mortise 241 corresponding to the tenon 213. The tenon 213 is engaged with the mortise 241, so as to fix the position of the porous member 240, and to isolate the working fluid in the compensation chamber 250 from the working fluid in the second channel C2.

Figure 3A:
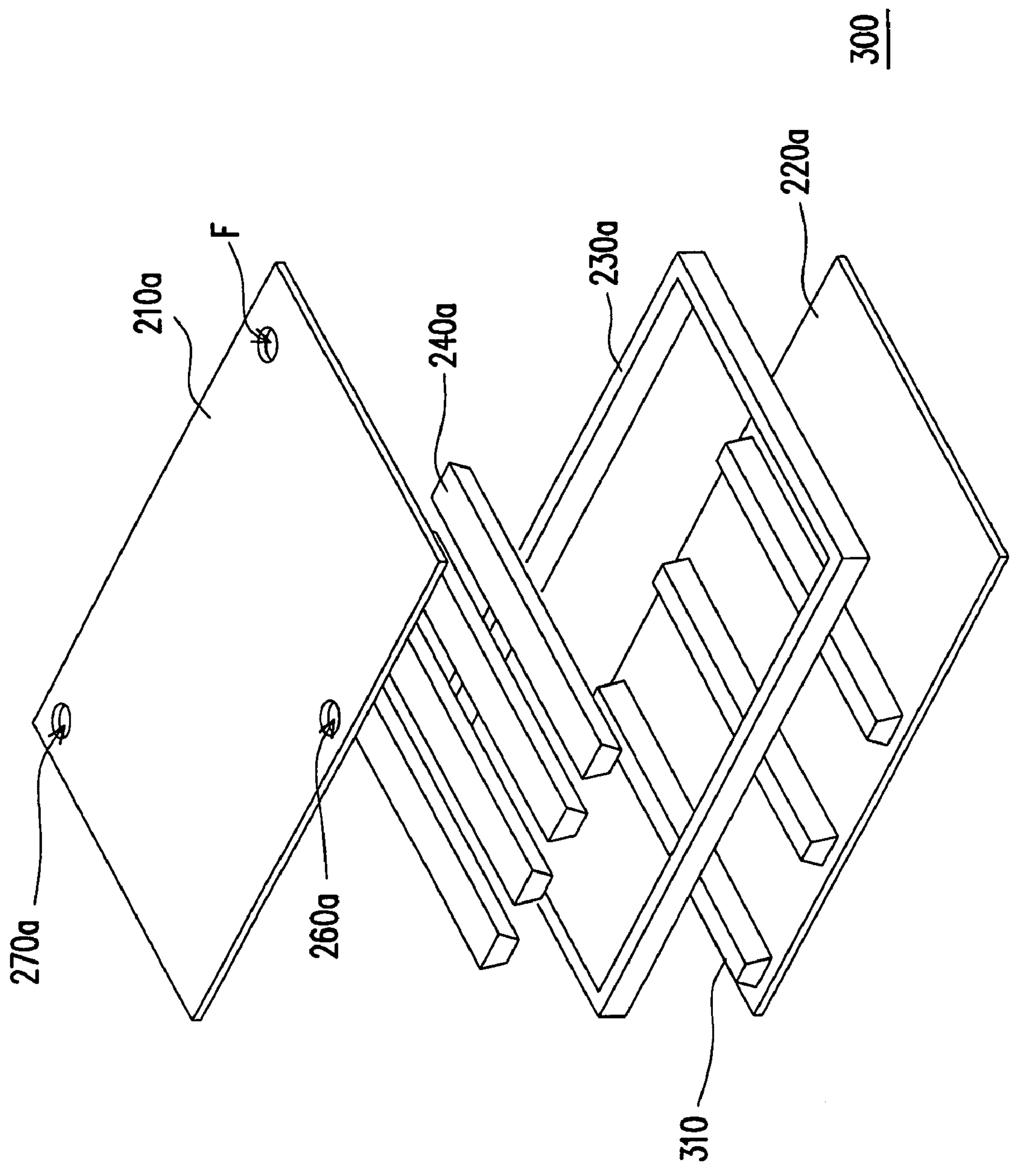
FIG. 3A is an exploded view of the evaporator according to another embodiment of the present invention.
Figure 3B:
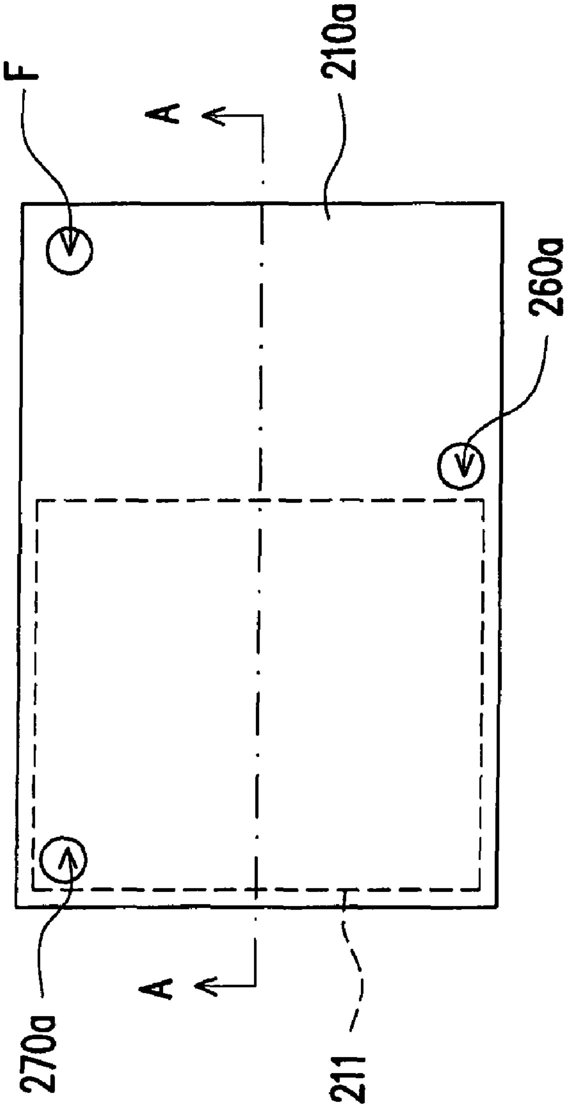
FIG. 3B is a front view of the evaporator of FIG. 3A.
Figure 3C:
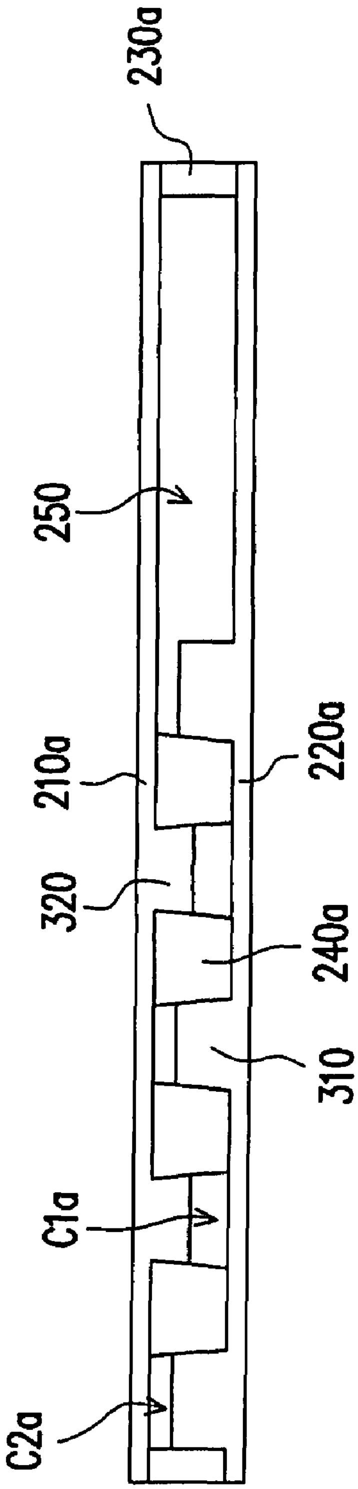
FIG. 3C is a sectional view of the evaporator taken along the section line A-A in FIG. 3B.

FIG. 3A is an exploded view of an evaporator according to another embodiment of the present invention, FIG. 3B is a front view of the evaporator of FIG. 3A, and FIG. 3C is a sectional view of the evaporator taken along a section line A-A in FIG. 3B. Referring to FIGS. 3A-3C, the evaporator 300 of this embodiment is similar to the above evaporator 200 (referring to FIG. 2A), the difference between the two is mentioned below. In the evaporator 300 of this embodiment, the top board 210*a* is in the shape of a flat plate and does not have the accommodation groove, and the top plate 210*a* and the side frame 230*a* are a combination of independent structures. Moreover, the evaporator 300 can further include a plurality of first partition units 310 and a plurality of second partition units 320. The first partition units 310 are disposed on the bottom board 220*a* and within the side frame 230*a*. The second partition units 320 are disposed on the top board 210*a* and within the side frame 230*a*.

In this embodiment, the number of each of the porous members 240*a*, the first channels C1*a* and the second channels C2*a* can be more than one. The first partition units 310 and the second partition units 320 partition the porous members 240*a*. In this embodiment, the first partition units 310 and the bottom board 220*a* can be a combination of independent structures. Moreover, the second partition units 320 and the top board 210*a* can be a combination of independent structures. However, in other embodiments, the first partition units and the bottom plate can be integrally formed, and the second partition units and the top plate can also be integrally formed. In the evaporator 300 in this embodiment, the second partition units 320, the porous members 240*a* and the bottom board 220*a* define the first channels C1*a*, and the first partition units 310, the porous members 240*a* and the top board 210*a* define the second channels C2*a*. Furthermore, the fluid inlet 260*a* and the fluid outlet 270*a* can be disposed at the top board 210*a*, but are not limited to this in the present invention. The evaporator 300 in this embodiment may not include the fluid collecting chamber. Instead, the working fluid in the second channels C2*a* directly flows out from the fluid outlet 270*a*. In addition, the evaporator 300 may not include the support units as well.

The evaporator 300 can also be in the shape of a flat plate, so the evaporator 300 has the advantages of the evaporator 200 (referring to FIG. 2A) as well.

Figure 4A:
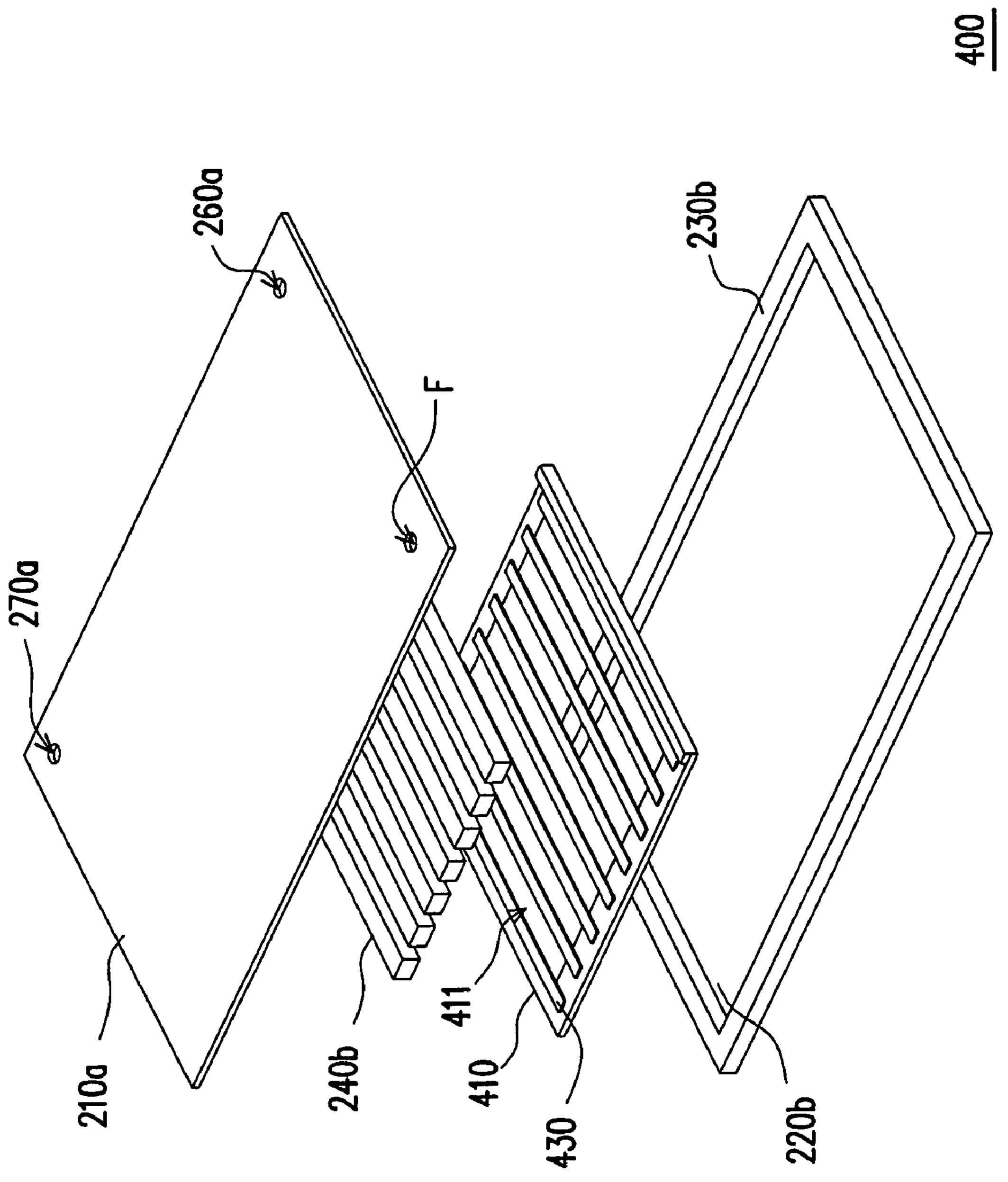
FIG. 4A is an exploded view of an evaporator according to still another embodiment of the present invention.
Figure 4B:
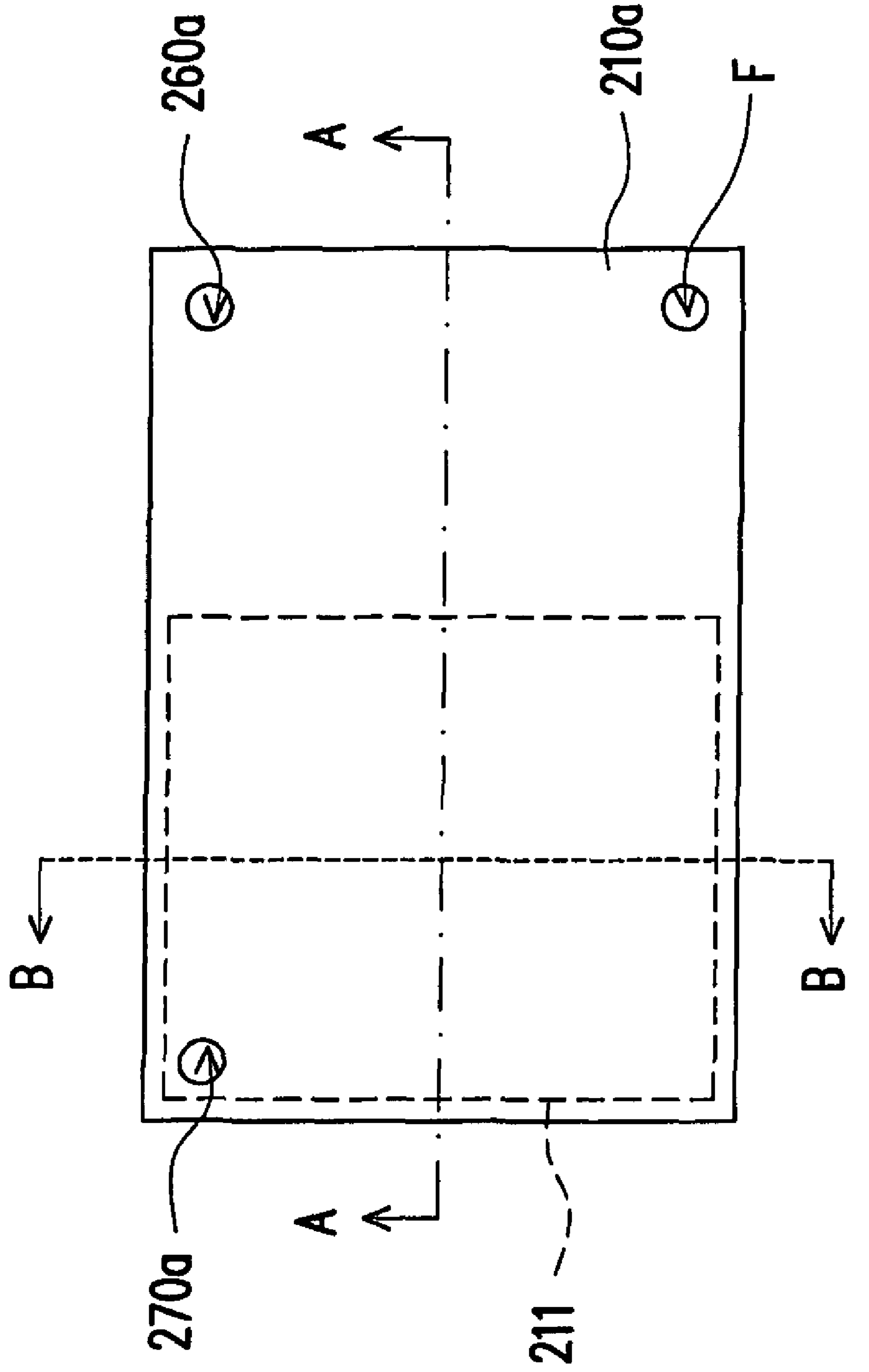
FIG. 4B is a front view of the evaporator of FIG. 4A.
Figure 4C:
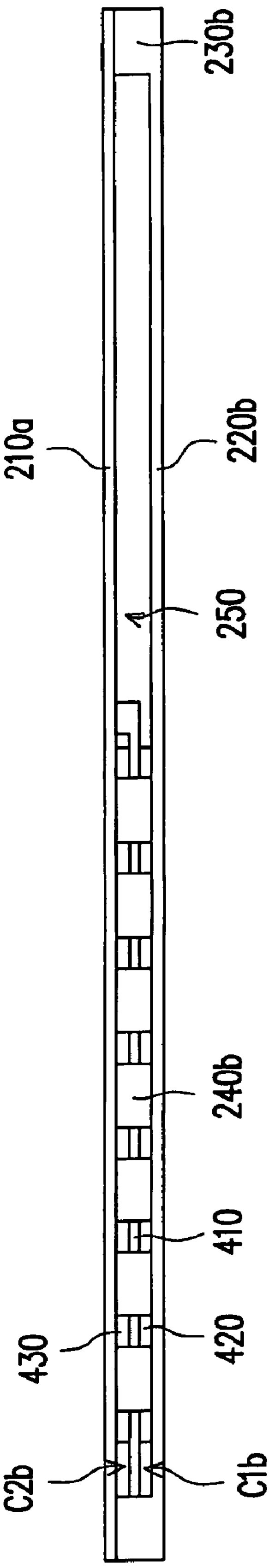
FIG. 4C is a sectional view of the evaporator taken along the section line A-A in FIG. 4B.
Figure 4D:
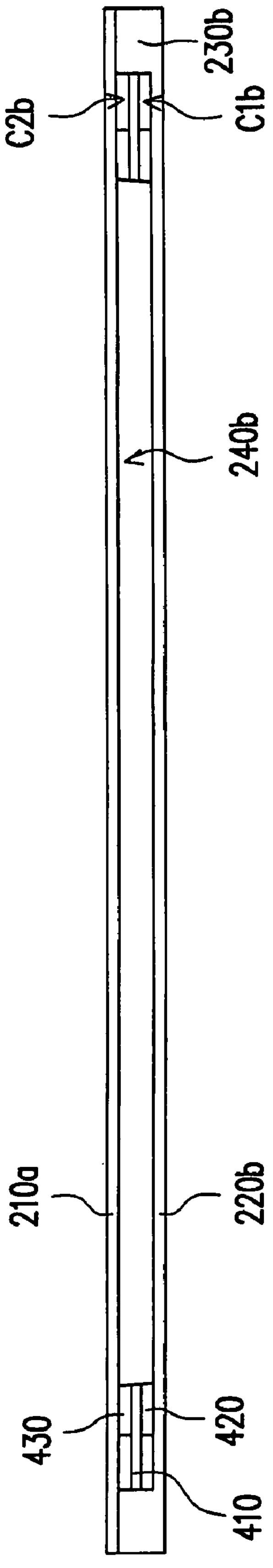
FIG. 4D is a sectional view of the evaporator taken along the section line B-B in FIG. 4B.

FIG. 4A is an exploded view of an evaporator according to still another embodiment of the present invention. FIG. 4B is a front view of the evaporator in FIG. 4A. FIG. 4C is a sectional view of the evaporator taken along the section line A-A in FIG. 4B. FIG. 4D is a sectional view of the evaporator taken along the section line B-B in FIG. 4B. Referring to FIGS. 4A-4D, the evaporator 400 in this embodiment is similar to the above evaporator 300 (referring to FIG. 3A), the difference between the two is mentioned below. The evaporator 400 of this embodiment can further include a heat insulation board 410. The heat insulation board 410 is disposed between the top board 210*a* and the bottom board 220*b*, so as to partition the first channel C1*b* and the second channel C2*b*. The material of the heat insulation board 410 is, for example, ceramic or other materials with heat insulation properties. In addition, the heat insulation board 410 can have at least one vacuum cavity or at least one cavity with gas therein, so as to achieve better heat insulating effect. Further, the heat insulation board 410 can have at least one opening 411, and the porous member 240*b* passes through the opening 411. In this embodiment, the first channel C1*b* and the second channel C2*b* can be disposed on two ends of the porous member 240*b*. The evaporator 400 can further include one first support unit 420 and at least one second support unit 430. The first support unit 420 connects the bottom board 220*b* and the heat insulation board 410. The second support unit 430 connects the top board 210*a* and the heat insulation board 410. The material of the first support unit 420 and the second support unit 430 is, for example, ceramic, metal, or other suitable materials. Moreover, in the evaporator 400 in this embodiment, the bottom board 220*b* and the side frame 230*b* are integrally formed, but are not limited to this in the present invention.

Figure 5A:
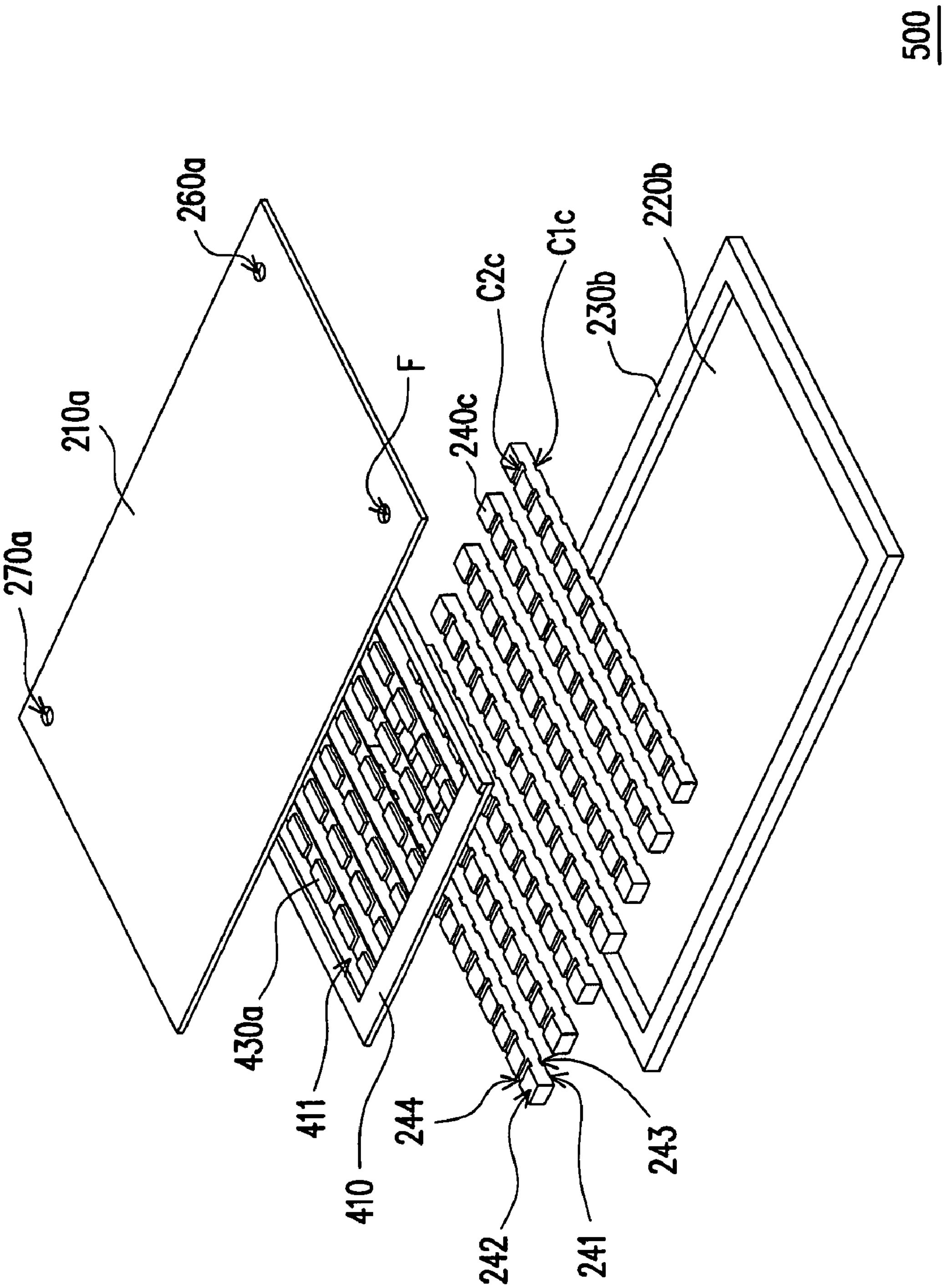
FIG. 5A is an exploded view of an evaporator according to another embodiment of the present invention.
Figure 5B:
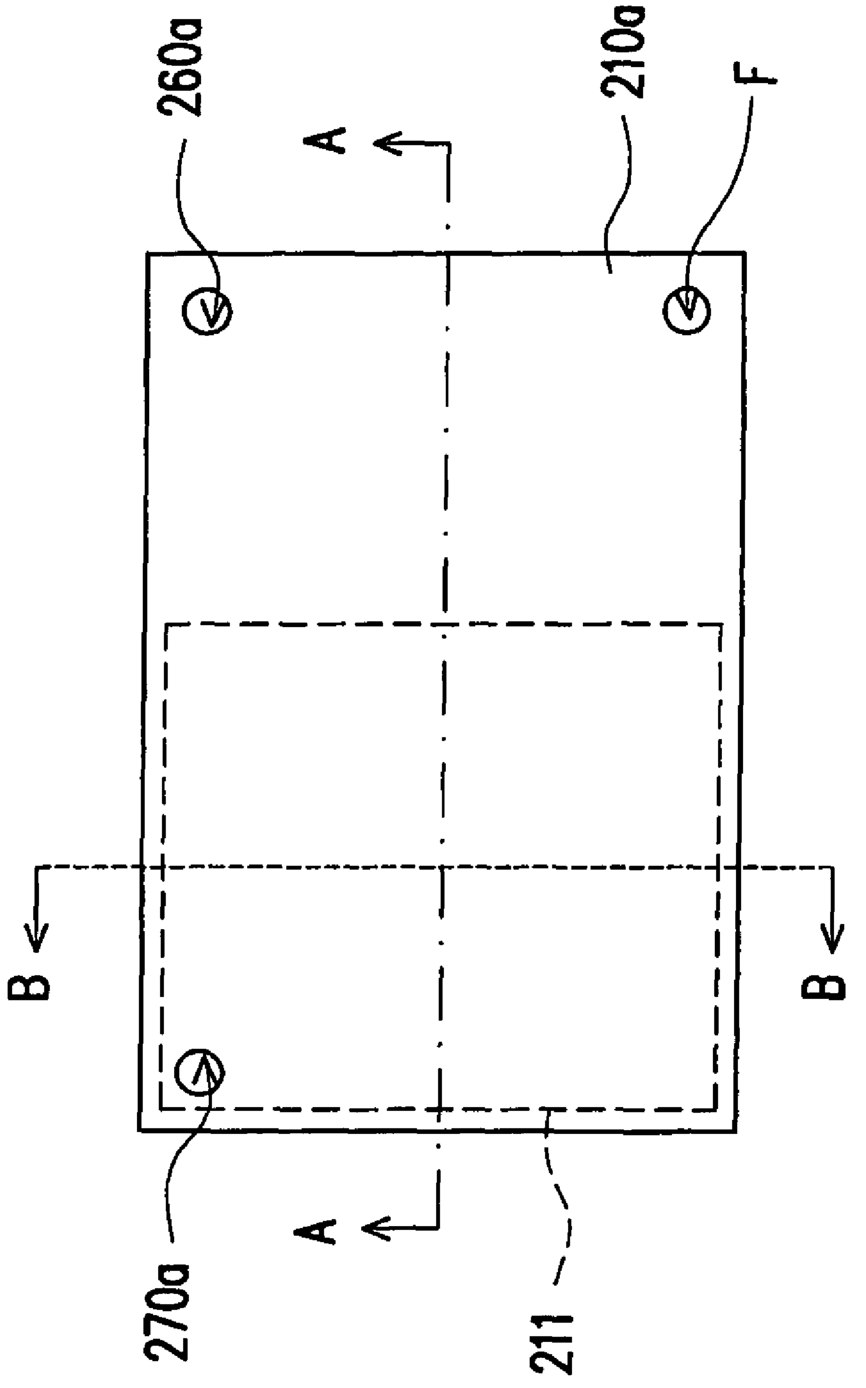
FIG. 5B is a front view of the evaporator of FIG. 5A.
Figure 5C:
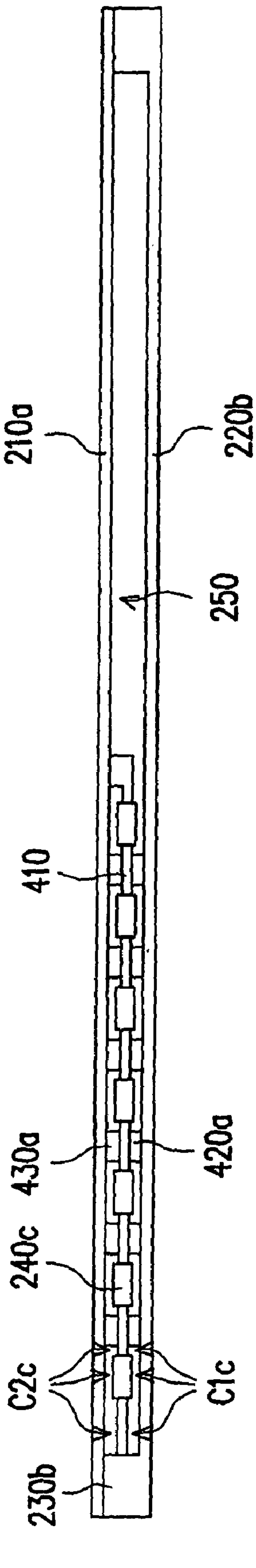
FIG. 5C is a sectional view of the evaporator taken along the section line A-A in FIG. 5B.
Figure 5D:
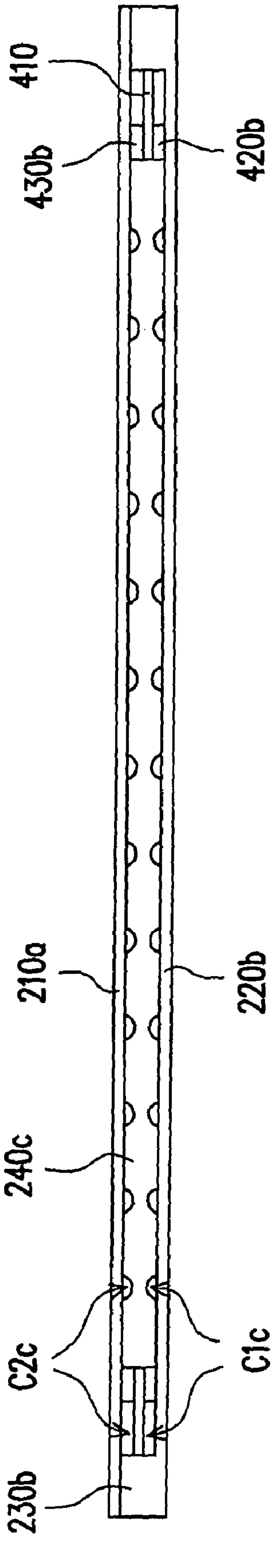
FIG. 5D is a sectional view of the evaporator taken along the section line B-B in FIG. 5B.

FIG. 5A is an exploded view of an evaporator according to yet another embodiment of the present invention. FIG. 5B is a front view of the evaporator of FIG. 5A. FIG. 5C is a sectional view of the evaporator taken along the section line A-A in FIG. 5B. FIG. 5D is a sectional view of the evaporator taken along the section line B-B in FIG. 5B. Referring to FIGS. 5A-5D, the evaporator 500 in this embodiment is similar to the above-mentioned evaporator 400 (referring to FIG. 4A), the difference between the two is mentioned below. In the evaporator 500 of this embodiment, the porous member 240*c* has a first surface 241 and a second surface 242. The first surface 241 faces the bottom board 220*b*, and can have at least one groove 243 to form a first channel C1*c*. The second surface 242 faces the top board 210*a*, and can have at least one groove 244 to form a second channel C2*c*.

Moreover, in this embodiment, the first support units 420*a* can be arranged apart, so as to form the first channel C1*c*. The second support units 430*a* can be arranged apart, so as to form the second channel C2*c*.

Figure 6A:
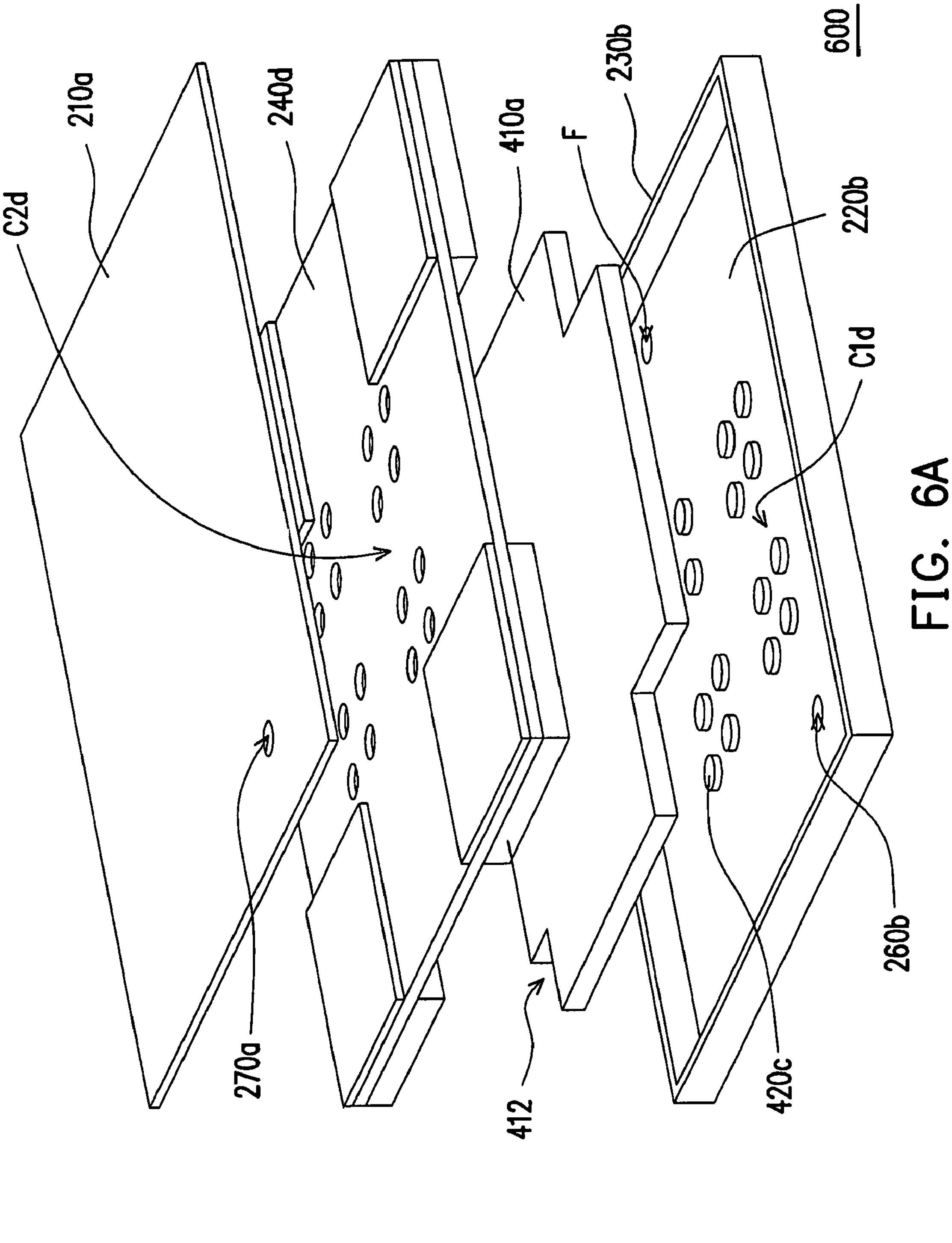
FIG. 6A is an exploded view of the evaporator according to another embodiment of the present invention.
Figure 6B:
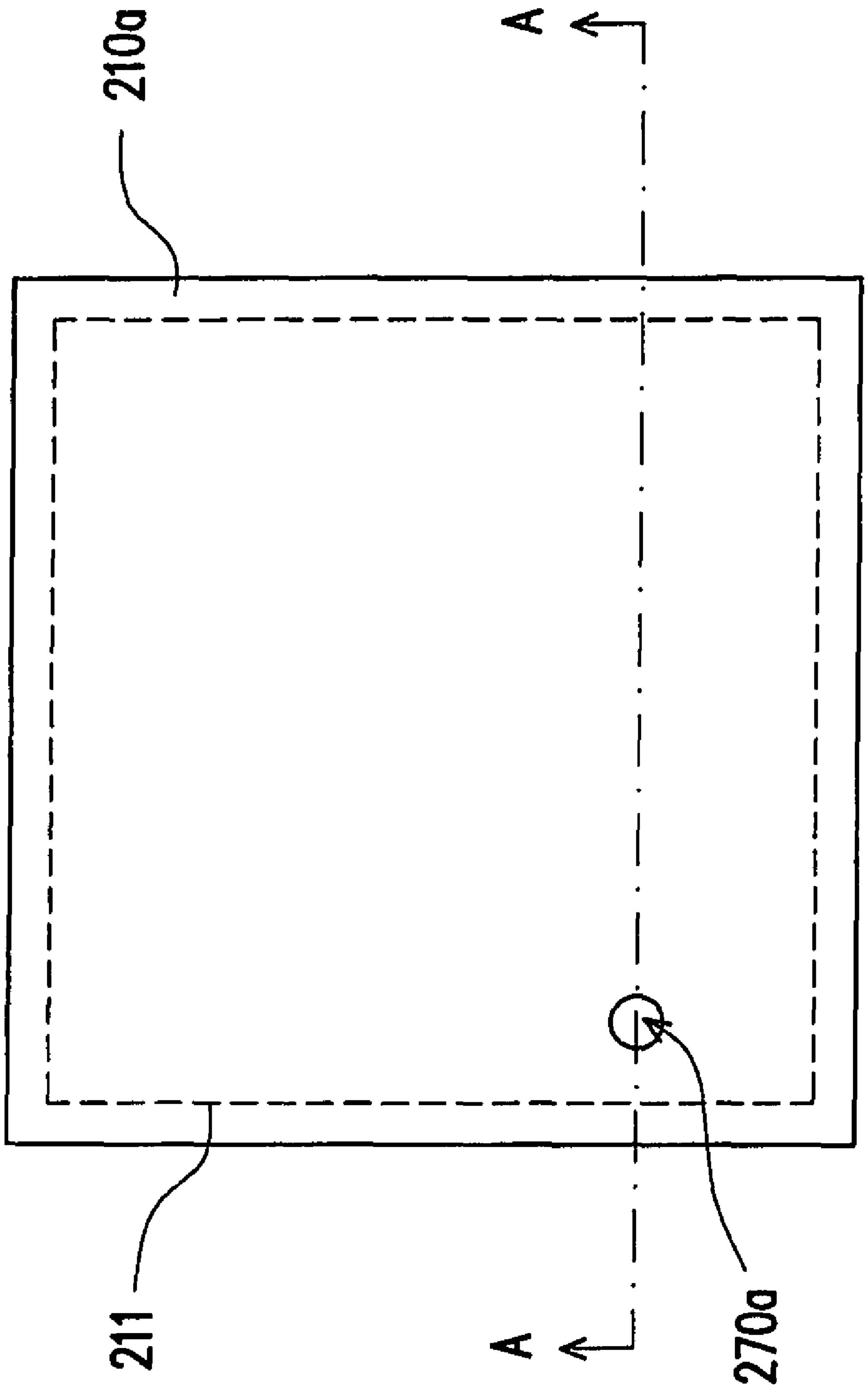
FIG. 6B is a front view of the evaporator of FIG. 6A.
Figure 6C:
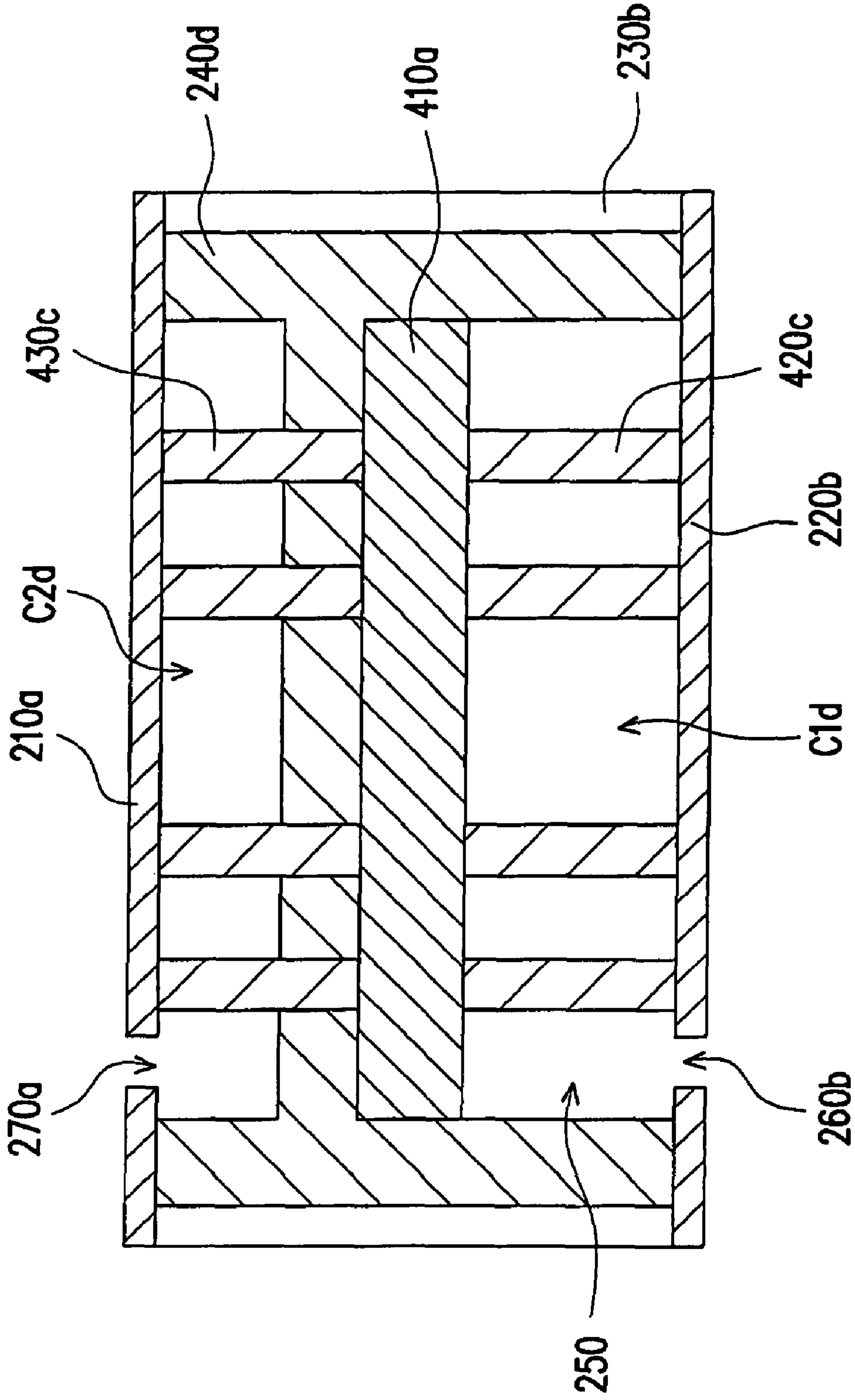
FIG. 6C is a sectional view of the evaporator taken along the section line A-A in FIG. 6B.

FIG. 6A is an exploded view of an evaporator according to another embodiment of the present invention, FIG. 6B is a front view of the evaporator of FIG. 6A, and FIG. 6C is a sectional view of the evaporator taken along a section line A-A in FIG. 6B. Referring to FIGS. 6A-6C, the evaporator 600 in this embodiment is similar to the above-mentioned evaporator 400 (referring to FIG. 4A), the difference between the two is mentioned below. The edge of a heat insulation board 410*a* of the evaporator 600 of this embodiment can have at least one chip 412. A part of a porous member 240*d* passes through the chip 412, so as to transfer the fluid from the first channel C1*d* to the second channel C2*d*. In this embodiment, the part of the porous member 240*d* at the chip 412 may connect the top board 210*a* and the bottom board 220*b*. Furthermore, the other part of the porous member 240*d* except that at the chip can be disposed at one side of the heat insulation board 410*a* in a plate shape, the second channel C2*d* can be located above the porous member 240*d*, and the first channel C1*d* can be located below the porous member 240*d*.

The fluid inlet 260*b* of the evaporator 600 can be disposed at the bottom board 220*b*, and the fluid outlet 270*a* can be disposed at the top board 210*a*. Moreover, the evaporator 600 may not include the compensation chamber. Instead, the working fluid flows into the first channel C1*d* directly through the fluid inlet 260*b*. In addition, in this embodiment, the second support unit 430*c* can pass through the porous member 240*d*, and connects the top board 210*a* and the heat insulation board 410*a*.

Figure 7A:
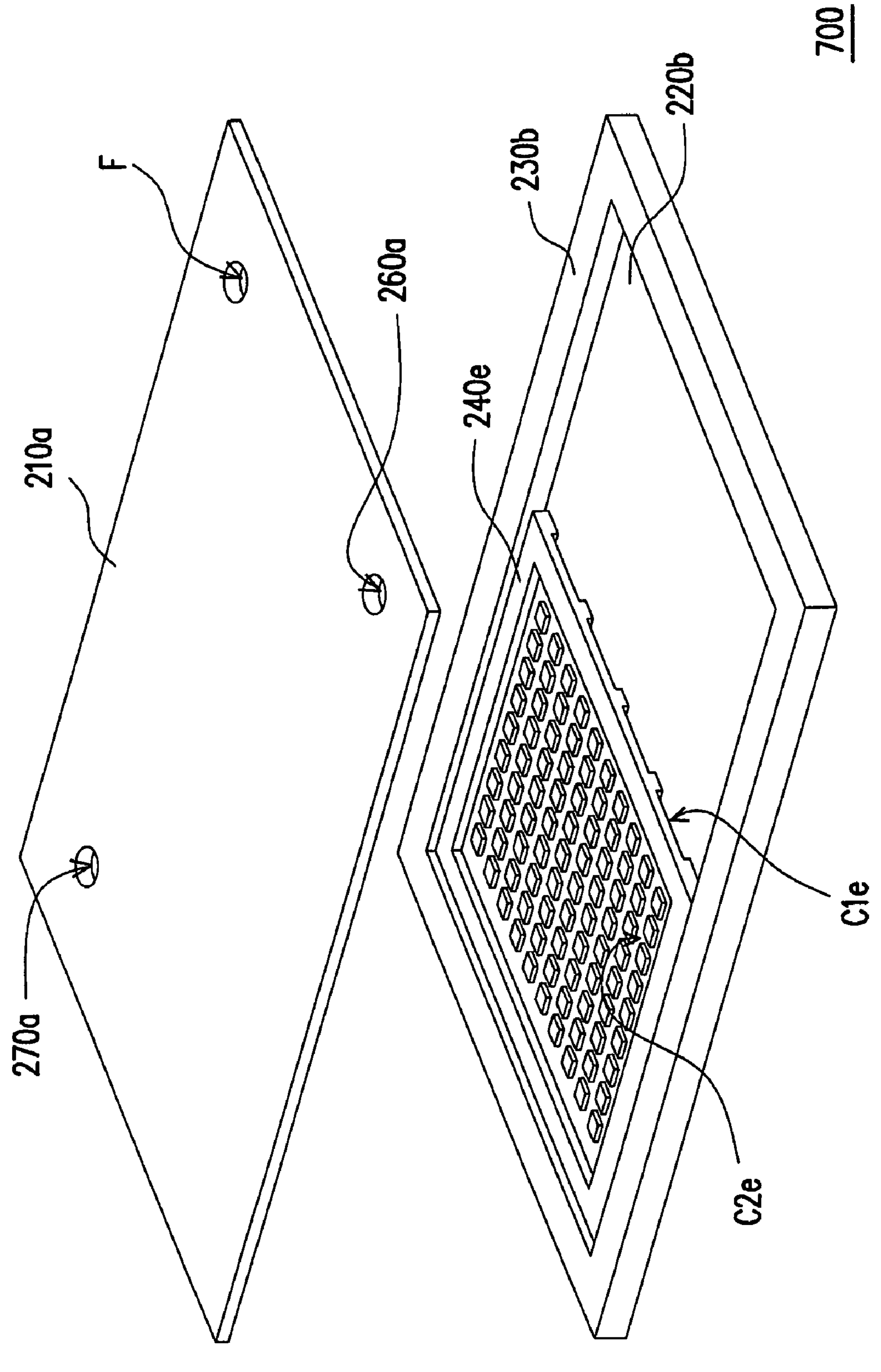
FIG. 7A is an exploded view of an evaporator according to still another embodiment of the present invention.
Figure 7B:
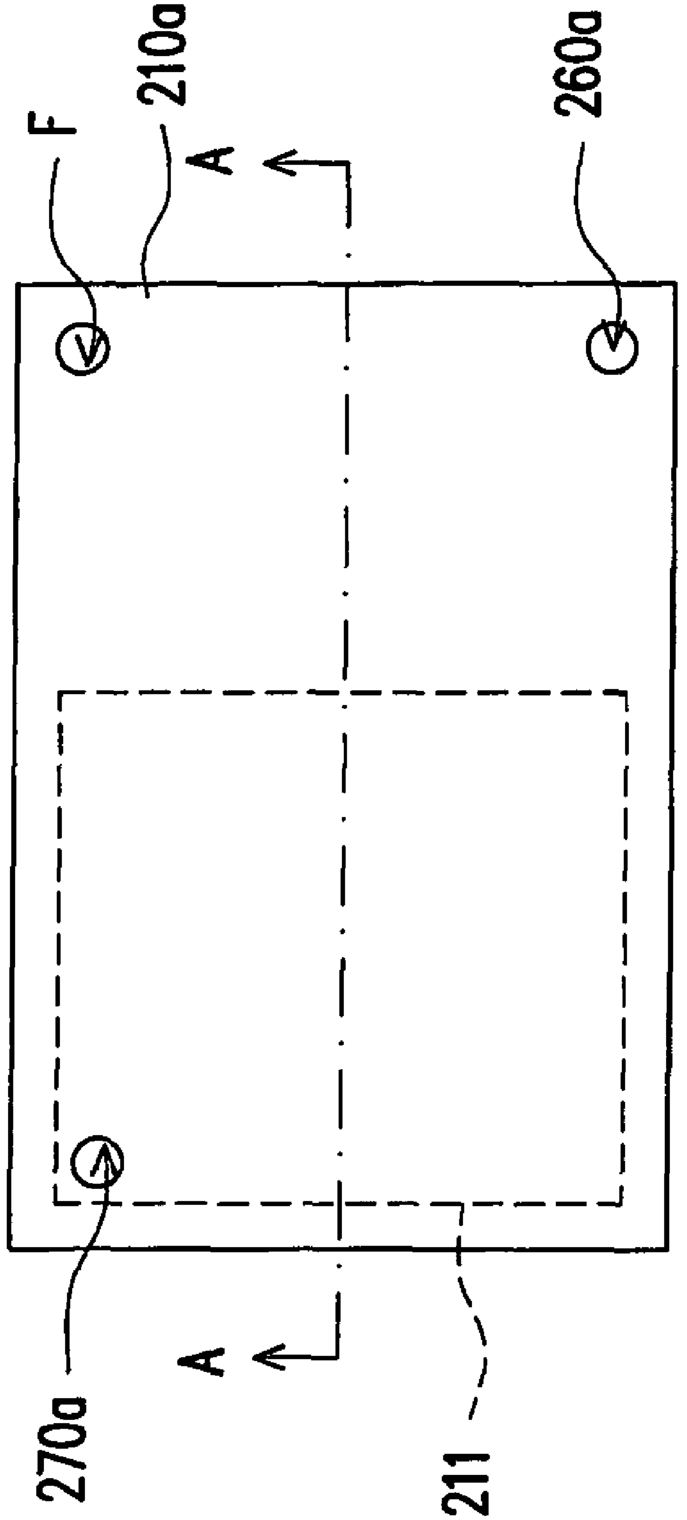
FIG. 7B is a front view of the evaporator of FIG. 7A.
Figure 7C:
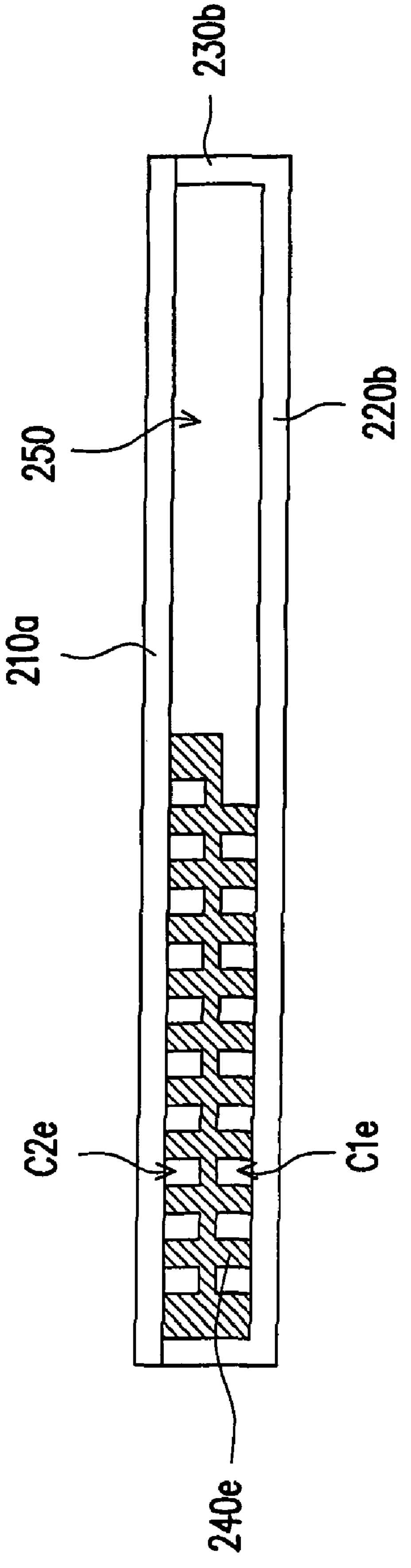
FIG. 7C is a sectional view of the evaporator taken along the section line A-A in FIG. 7B.

FIG. 7A is an exploded view of an evaporator according to another embodiment of the present invention, FIG. 7B is a front view of the evaporator of FIG. 7A, and FIG. 7C is a sectional view of the evaporator taken along a section line A-A in FIG. 7B. Referring to FIGS. 7A-7C, the evaporator 700 of this embodiment is similar to the above-mentioned evaporator 500 (referring to FIG. 5A), the difference between the two is mentioned below. The evaporator 700 in this embodiment does not include the heat insulation board, the first support unit, and the second support unit, but directly uses the porous member 240*e* to partition the second channel C2*e* and the compensation chamber 250, and to partition the second channel C2*e* and the first channel C1*e*.

Figure 8A:
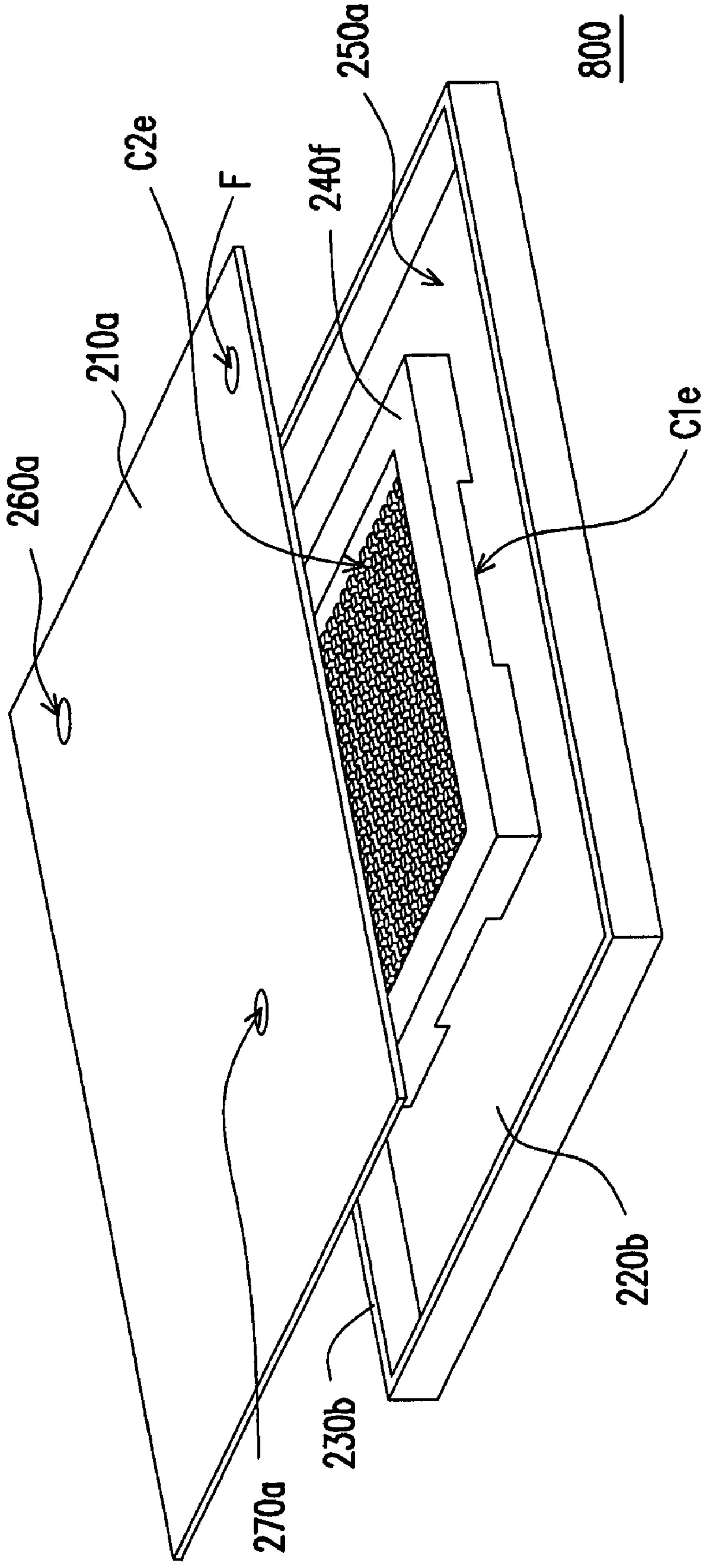
FIG. 8A is an exploded view of an evaporator according to another embodiment of the present invention.
Figure 8B:
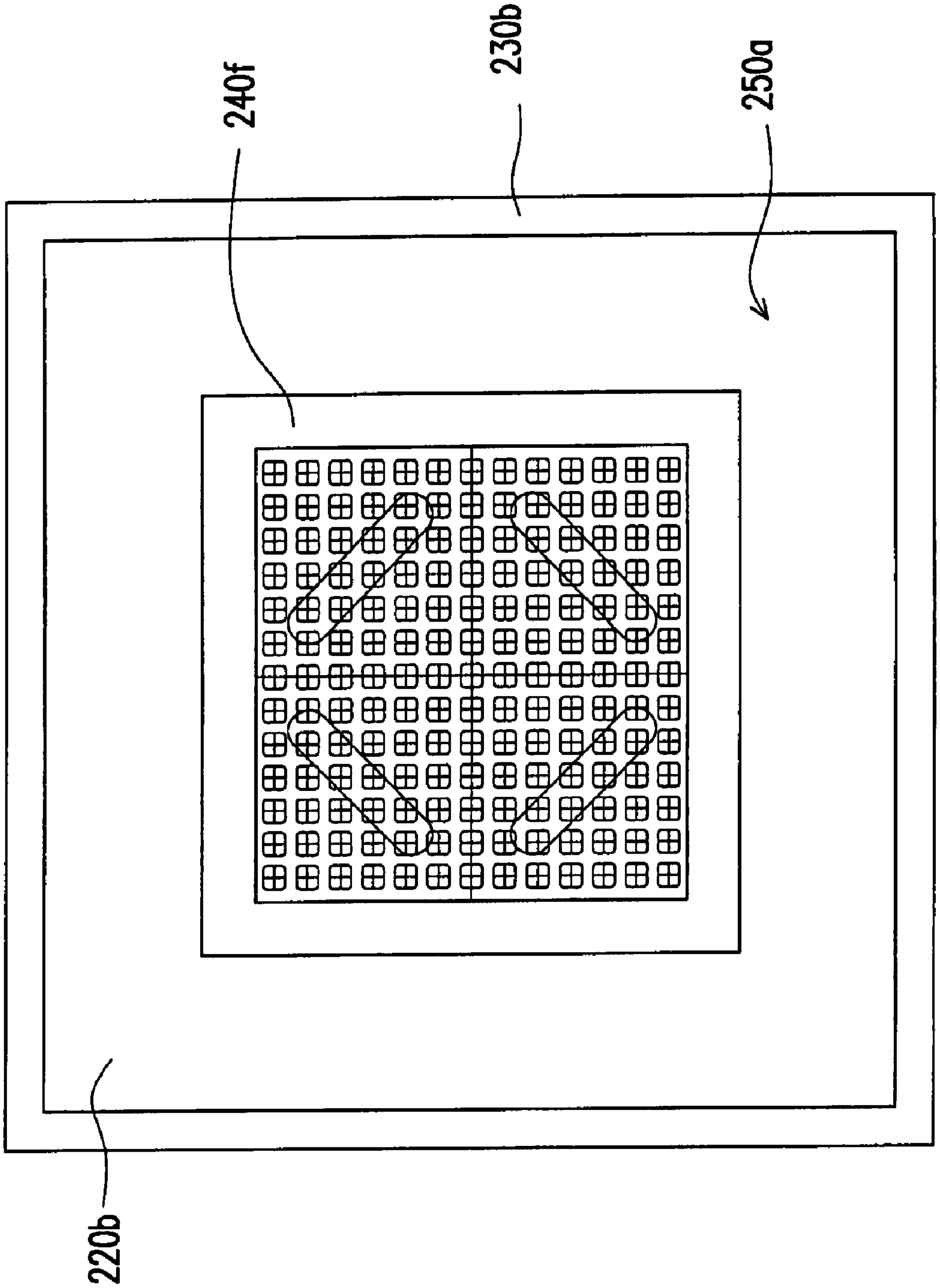
FIG. 8B shows the bottom board and the porous member of FIG. 8A.
Figure 8C:
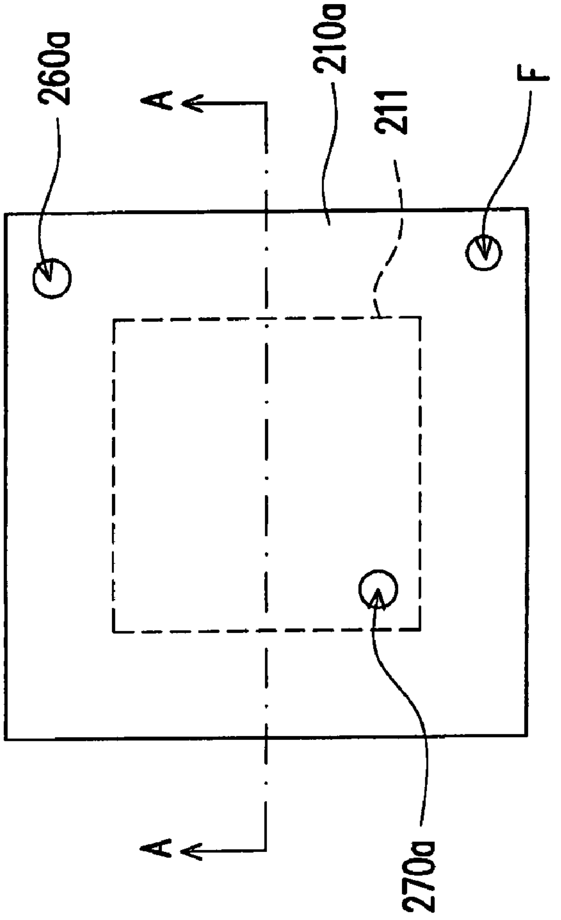
FIG. 8C is a front view of the evaporator of FIG. 8A.
Figure 8D:
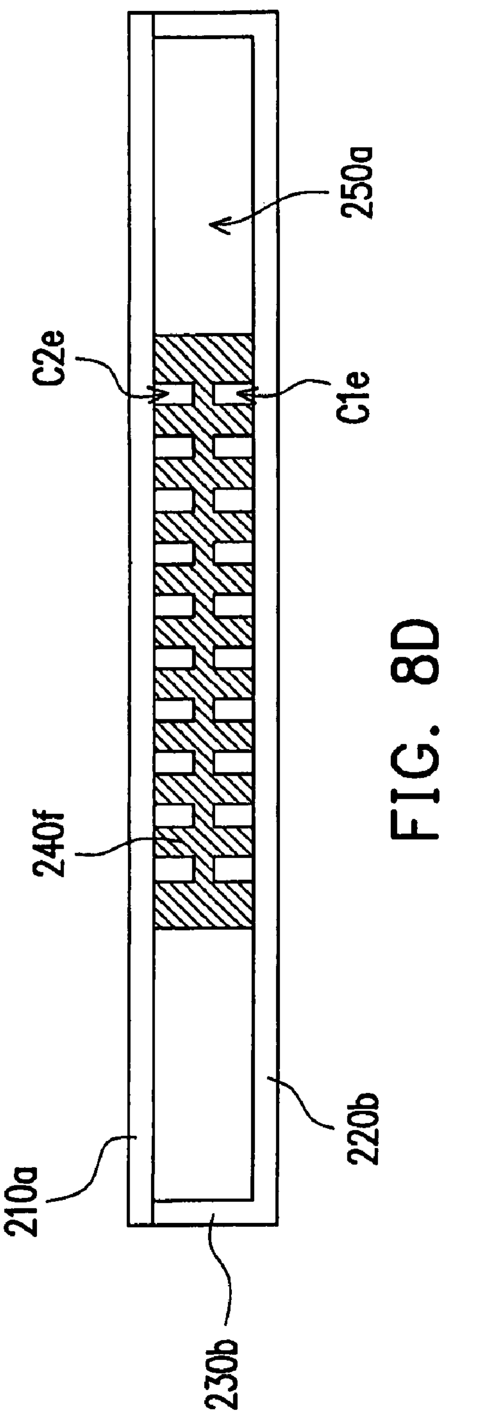
FIG. 8D is a sectional view of the evaporator taken along the section line A-A in FIG. 8C.

FIG. 8A is an exploded view of an evaporator according to another embodiment of the present invention. FIG. 8B shows the bottom board and the porous member of FIG. 8A. FIG. 8C is a front view of the evaporator of FIG. 8A. FIG. 8D is a sectional view of the evaporator taken along the section line A-A in FIG. 8C. Referring to FIGS. 8A-8D, the evaporator 800 in this embodiment is similar to the above-mentioned evaporator 700 (referring to FIG. 7A), except that in the evaporator 800 of this embodiment, the compensation chamber 250*a* surrounds the porous member 240*f*.

Figure 9A:
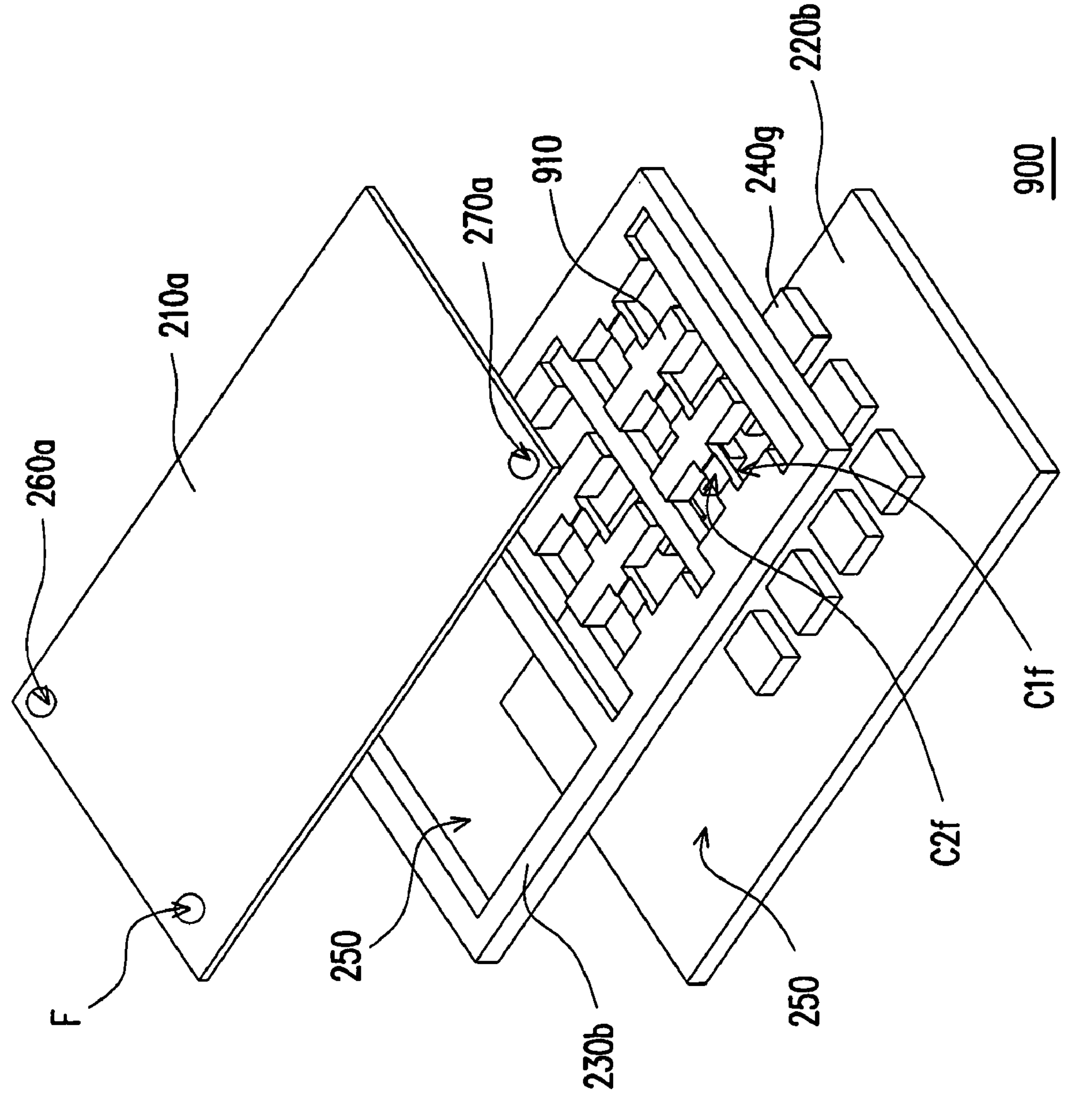
FIG. 9A is an exploded view of the evaporator according to another embodiment of the present invention.
Figure 9B:
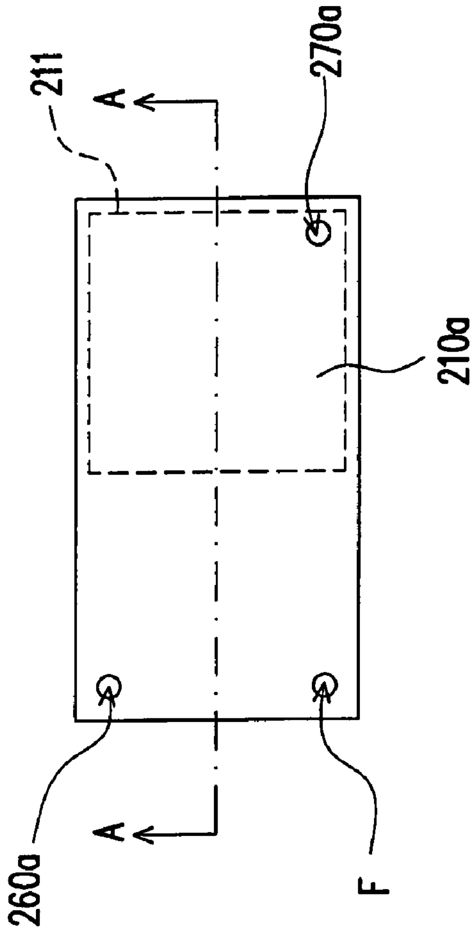
FIG. 9B is a front view of the evaporator of FIG. 9A.
Figure 9C:
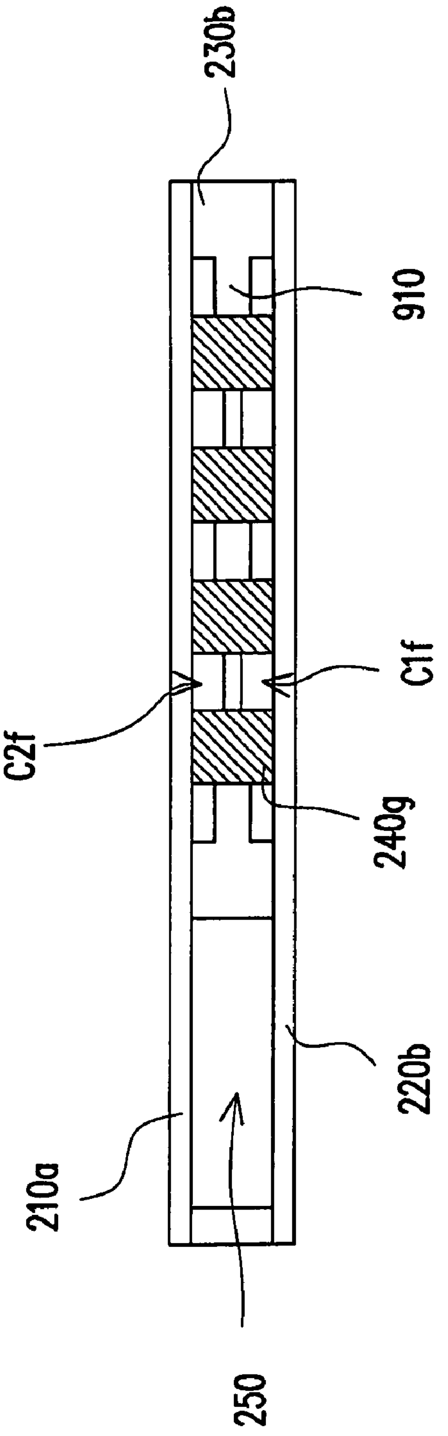
FIG. 9C is a sectional view of the evaporator taken along the section line A-A in FIG. 9B.

FIG. 9A is an exploded view of an evaporator according to another embodiment of the present invention, FIG. 9B is a front view of the evaporator of FIG. 9A, and FIG. 9C is a sectional view of the evaporator taken along a section line A-A in FIG. 9B. Referring to FIGS. 9A-9C, the evaporator 900 in this embodiment is similar to the above-mentioned evaporator 700 (referring to FIG. 7A), the difference between the two is mentioned below. The evaporator 900 in this embodiment has a support frame 910 disposed among the top board 210*a*, the bottom board 220*b*, and the side frame 230*b*, so as to partition the compensation chamber 250, the first channel C1*f*, and the second channel C2*f*. Moreover, in this embodiment, the porous member 240*g* can pass through the support frame 910 to connect the top board 210*a* and the bottom board 220*b*. In addition, in this embodiment, the first channel C1*f* can be disposed among the support frame 910, the porous member 240*g*, and the bottom board 220*b*, and the second channel C2*f* can be disposed among the support frame 910, the porous member 240*g*, and the top plate 210*a*.

Figure 10:
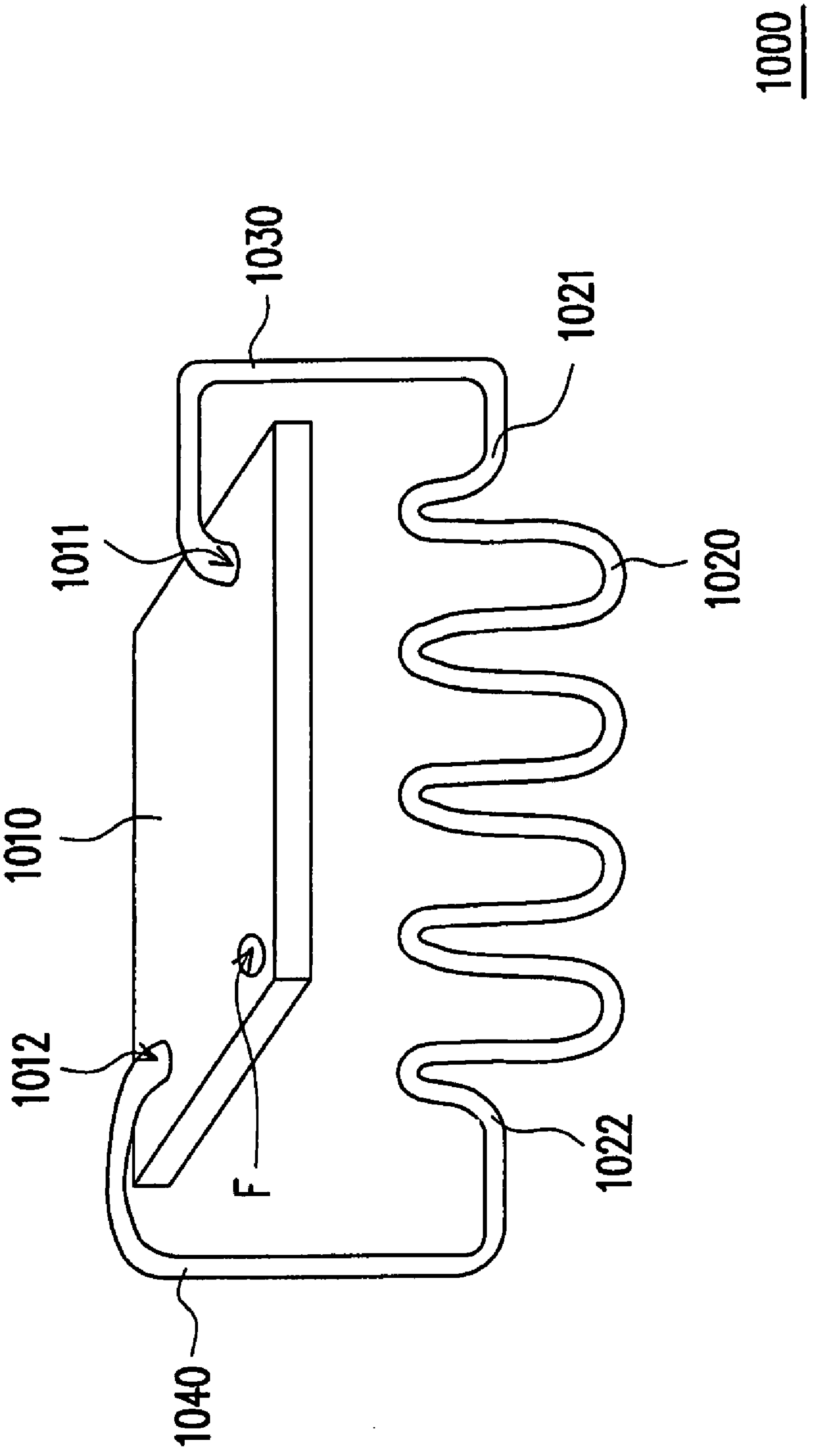
FIG. 10 is a schematic structural view of a loop heat pipe module according to one embodiment of the present invention.

FIG. 10 is a schematic structural view of a loop heat pipe module according to one embodiment of the present invention. Referring to FIG. 10, the loop heat pipe module 1000 of this embodiment includes an evaporator 1010, a condenser 1020, at least one first fluid transmission pipe 1030, and at least one second fluid transmission pipe 1040. The evaporator 1010 can be an evaporator according to any one of the above embodiments. The condenser 1020 is suitable for containing the working fluid, and has at least one fluid inlet 1021 and at least one fluid outlet 1022. The first fluid transmission pipe 1030 communicates the fluid outlet 1011 of the evaporator 1010 and the fluid inlet 1021 of the condenser 1020, and the second fluid transmission pipe 1040 communicates the fluid outlet 1022 of the condenser 1020 and the fluid inlet 1012 of the evaporator 1010.

The working fluid in the evaporator 1010 absorbs the heat from the heat source, and changes from the liquid to the gas state, and then is transmitted to the condenser 1020 from the first fluid transmission pipe 1030. The working fluid in the condenser 1020 releases the heat thereof to the outside through the condenser 1020, and thus the working fluid changes from the gas state to the liquid state, and is transmitted back to the evaporator 1010 by the second fluid transmission pipe 1040.

In the loop heat pipe module 1000 of this embodiment, as the heat transfer efficiency of the evaporator 1010 is better, the heat transfer efficiency of the loop heat pipe module 1000 is also better. In addition, as the shape and length of the first fluid transmission pipe 1030 and the second fluid transmission pipe 1040 connecting the evaporator 1010 and the condenser 1020 can be changed as required, the relative positions and the distance between the evaporator 1010 and the condenser 1020 can also be changed as required. Thus, the loop heat pipe module 1000 has a longer heat transfer distance, and has a heat transfer path that can be changed for different requirements without being influenced by the gravity.

Figure 11A:
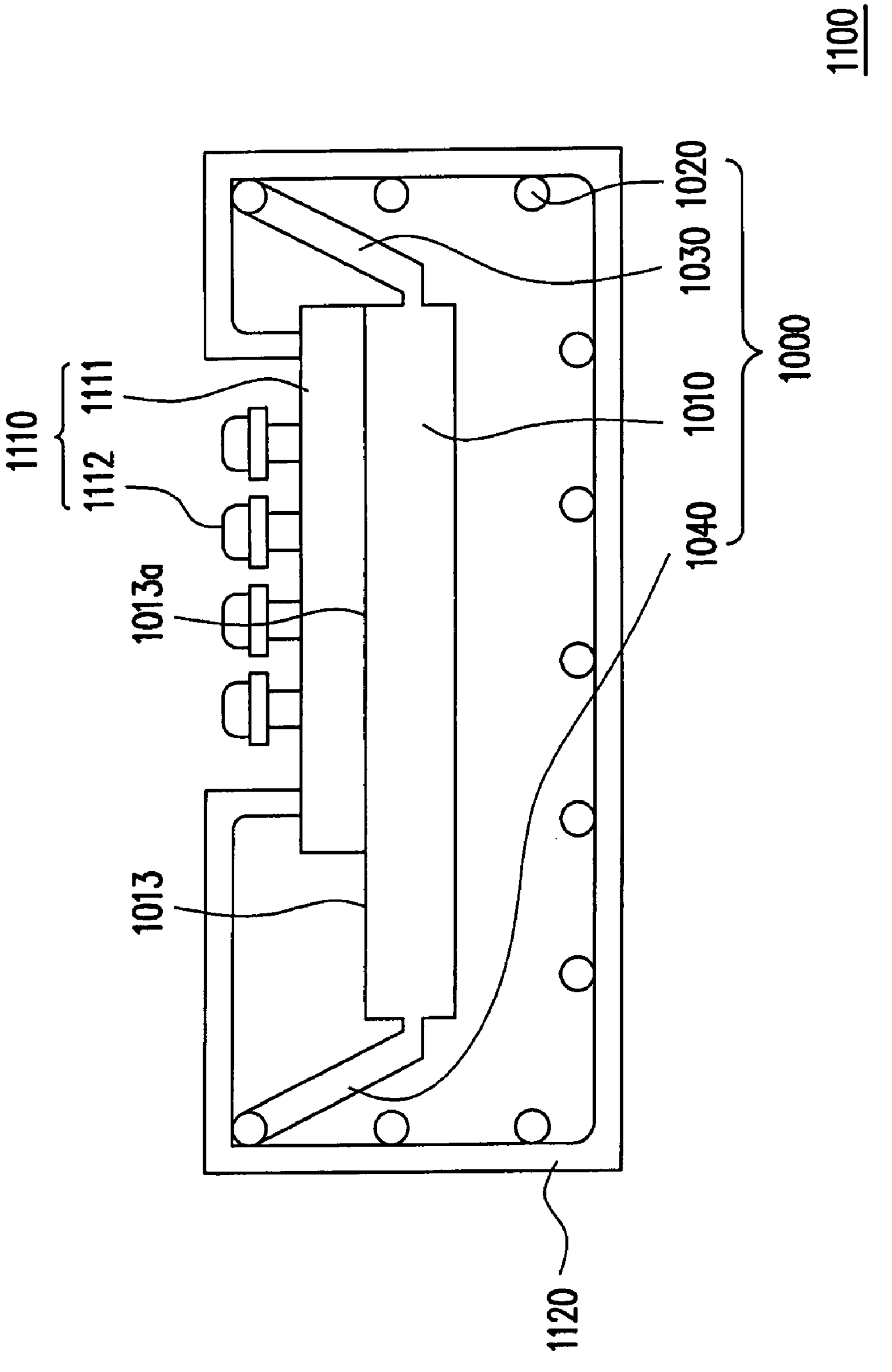
FIG. 11A is a schematic structural view of the heat generating apparatus according to an embodiment of the present invention.
Figure 11B:
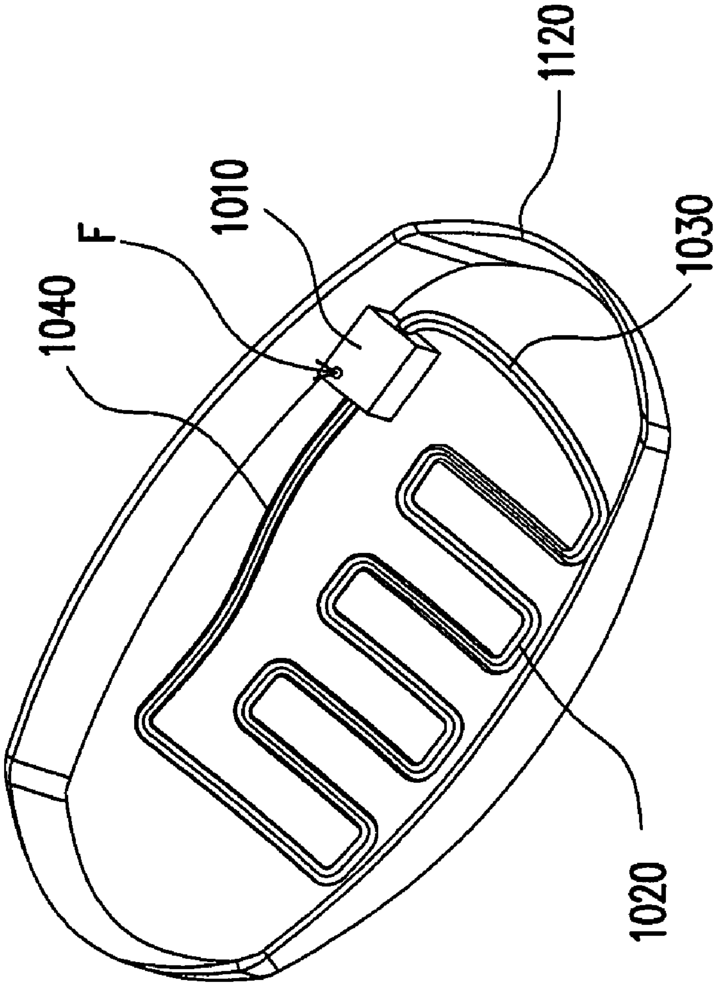
FIG. 11B shows a part of the heat dissipating unit and the loop heat pipe module in FIG. 11A.

FIG. 11A is a schematic structural view of a heat generating apparatus according to an embodiment of the present invention, and FIG. 11B shows a part of the heat dissipating unit and the loop heat pipe module in FIG. 11A. Referring to FIGS. 11A and 11B, the heat generating apparatus 1100 of this embodiment includes a heat generating unit 1110, a heat dissipating unit 1120, and the loop heat pipe module 1000 described above. The heat conducting portion 1013*a* of the top board 1013 of the evaporator 1010 of the loop heat pipe module 1000 is connected with the heat generating unit 1110, so as to absorb the heat from the heat generating unit 1110. The condenser 1020 is connected with the heat dissipating unit 1120, such that the heat from the condenser 1020 is dissipated to the environment through the heat dissipating unit 1120. In this embodiment, the heat generating unit 1110 can include a carrier 1111 and at least one light emitting device 1112. The carrier 1111 is connected with the heat conducting portion 1013*a*, and the light emitting device 1112 is disposed on the carrier 1111. In other words, in this embodiment, the heat generating unit 1110 is, for example, a illumination apparatus. In addition, the light emitting device 1112 is, for example, an LED or other suitable light emitting devices.

In this embodiment, at least a part of the condenser 1020 extends in a curved shape along the surface of the heat dissipating unit 1120. More specifically, in this embodiment, the heat dissipating unit is, for example, a housing, and at least a part of the condenser 1020 extends in a curved shape along the inner surface of the housing, so as to dissipate the heat with the large surface area of the housing. However, in other embodiments, at least a part of the condenser can also extend in a curved shape along the outer surface of the housing. It should be noted that the heat dissipating unit is not limited to a housing in the present invention. In other embodiments, the heat dissipating unit can also be other structures with the heat dissipating function, such as heat dissipating fins, heat dissipating plates, and so on.

In the heat generating apparatus 1100 of this embodiment, as the loop heat pipe module 1000 has better heat dissipating performance, the heat generating apparatus 1100 has better heat dissipating performance, which further improves the working efficiency of the heat generating apparatus 1100. In specific, in this embodiment, as the heat generated by the light emitting device 1112 can be dissipated from the housing effectively, the light emitting device 1112 has high working efficiency. In other words, when the light emitting device 1112 is an LED, the luminance of the light emitting device 1112 is high, and the color shift of the light emitted therefrom is low.

It should be noted that the heat generating apparatus is not limited to be an illumination apparatus in the present invention. In other embodiments, the heat generating apparatus can also be other apparatuses in need of heat dissipation.

To sum up, a normal conventional evaporator is often in a cylindrical shape, and normally must be embedded into a heat conducting block to be combined with the heat source easily. However, the evaporator in the present invention can be in a shape of a flat plate, which enables the evaporator to be combined with the heat source directly and to occupy less space. Furthermore, as the outer surface area of the heat conducting portion is large, the contact area between the heat conducting portion and the heat source can be relatively large, so as to effectively improve the heat transfer efficiency of the evaporator.

In the loop heat pipe module in the present invention, as the heat transfer efficiency of the evaporator is better, the heat transfer efficiency of the loop heat pipe module is also better. In addition, as the shape and length of the first fluid transmission pipe and the second fluid transmission pipe connecting the evaporator and the condenser can be changed as required, the relative positions and the distance between the evaporator and the condenser can also be changed as required. Thus, the loop heat pipe module has a longer heat transfer distance, and has a heat transfer path that can be changed for different requirements without being influenced by the gravity.

In the heat generating apparatus of the present invention, as the loop heat pipe module has better heat dissipating performance, the heat generating apparatus has better heat dissipating performance as well, which further improves the working efficiency of the heat generating apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An evaporator, suitable for absorbing heat from a heat source, the evaporator comprising:
- a top board;
- a bottom board;
- a side frame, connecting the top board and the bottom board; and
- a plurality of porous members, disposed between the top board and the bottom board and within the side frame, extending in a first direction, and arranged in a second direction, wherein the first direction and the second direction are substantially perpendicular, and a part of the top board covering the porous members is a heat conducting portion near the heat source,
- wherein the top board has:
- at least one first channel, adjacent to the bottom board and the porous members, for containing a working fluid; and
- at least one second channel, adjacent to the top board and the porous members, for containing the working fluid, wherein the porous members are suitable for transferring the working fluid from the first channel to the second channel;
- wherein the bottom board has:
- at least one fluid inlet, communicating with the first channel; and
- at least one fluid outlet, communicating with the second channel.

2. The evaporator as claimed in claim 1, wherein the porous member has:
- a first surface, facing the bottom board, the first surface having at least one groove, so as to form the first channel; and
- a second surface, facing the top board, the second surface having at least one groove, so as to form the second channel.

3. The evaporator as claimed in claim 1, further comprising a heat insulation board, disposed between the top board and the bottom board, for partitioning the first channel and the second channel.

4. The evaporator as claimed in claim 3, wherein the heat insulation board has at least one opening, and the porous member passes through the opening.

5. The evaporator as claimed in claim 3, wherein edge of the heat insulation board has at least one chip, and a part of the porous member passes through the chip.

6. The evaporator as claimed in claim 3, wherein the heat insulation board has at least one cavity.

7. The evaporator as claimed in claim 3, further comprising:
- at least one first support unit, connecting the bottom board and the heat insulation board; and
- at least one second support unit, connecting the top board and the heat insulation board.

8. The evaporator as claimed in claim 1, further comprising:
- a plurality of first partition units, disposed on the bottom board and within the side frame; and
- a plurality of second partition units, disposed on the top board and within the side frame,
- wherein a number of each of the at least one porous member, the at least one first channel, and the at least one second channel is more than one; the first partition units and the second partition units partition the porous members; the second partition units, the porous members and the bottom board define the first channels; while the first partition units, the porous members and the top board define the second channels.

9. The evaporator as claimed in claim 1, further having a compensation chamber, located between the porous member and the side frame, for containing the working fluid, wherein the fluid inlet communicates with the first channel through the compensation chamber.

10. The evaporator as claimed in claim 9, further comprising a support frame disposed among the top board, the bottom board, and the side frame, for partitioning the compensation chamber, the first channel, and the second channel.

11. The evaporator as claimed in claim 9, further having at least one filling opening, communicating with the compensation chamber.

12. The evaporator as claimed in claim 1, further having a fluid collecting chamber, located between the porous member and the side frame, wherein the fluid collecting chamber communicates with the fluid outlet and the second channel, the working fluid in the second channel is collected in the fluid collecting chamber, and is output through the fluid outlet.

13. The evaporator as claimed in claim 1, wherein the top board has at least one accommodation groove, for accommodating the porous member, the second channel is located between the top board and the porous member, and the first channel is located at one side of the porous member.

14. The evaporator as claimed in claim 1, further comprising at least one support unit, connecting the top board and the bottom board.

15. The evaporator as claimed in claim 1, wherein the side frame and the top board are integrally formed, or the side frame and the bottom board are integrally formed.

16. The evaporator as claimed in claim 1, wherein the working fluid comprises water, acetone, ammonia, refrigerant, nano fluid, or a combination thereof.

17. The evaporator as claimed in claim 1, further having at least one filling opening, communicating with the first channel.

18. A loop heat pipe module, comprising:
- an evaporator, suitable for absorbing heat from a heat source, the evaporator comprising:
  - a top board;
  - a bottom board;
  - a side frame, connecting the top board and the bottom board; and
  - a plurality of porous members, disposed between the top board and the bottom board and within the side frame, extending in a first direction, and arranged in a second direction, wherein the first direction and the second direction are substantially perpendicular, and a part of the top board covering the porous members is a heat conducting portion near the heat source,
  - wherein the top board has:
  - at least one first channel, adjacent to the bottom board and the porous members, for containing a working fluid; and
  - at least one second channel, adjacent to the top board and the porous members, for containing the working fluid, wherein the porous members are suitable for transferring the working fluid from the first channel to the second channel;
  - wherein the bottom board has:
  - at least one fluid inlet, communicating with the first channel; and
  - at least one fluid outlet, communicating with the second channel;
- a condenser, suitable for containing the working fluid, and having at least one fluid inlet and at least one fluid outlet;
- at least one first fluid transmission pipe, connecting the fluid outlet of the evaporator and the fluid inlet of the condenser; and
- at least one second fluid transmission pipe, connecting the fluid outlet of the condenser and the fluid inlet of the evaporator.

19. The loop heat pipe module as claimed in claim 18, wherein the porous member has:
- a first surface, facing the bottom board, the first surface having at least one groove, so as to form the first channel; and
- a second surface, facing the top board, the second surface having at least one groove, so as to form the second channel.

20. The loop heat pipe module as claimed in claim 18, wherein the evaporator further comprises a heat insulation board, disposed between the top board and the bottom board, for partitioning the first channel and the second channel.

21. The loop heat pipe module as claimed in claim 20, wherein the heat insulation board has at least one opening, and the porous member passes through the opening.

22. The loop heat pipe module as claimed in claim 20, wherein edge of the heat insulation board has at least one chip, and a part of the porous member passes through the chip.

23. The loop heat pipe module as claimed in claim 20, wherein the heat insulation board has at least one cavity.

24. The loop heat pipe module as claimed in claim 20, wherein the evaporator further comprises:
- at least one first support unit, connecting the bottom board and the heat insulation board; and
- at least one second support unit, connecting the top board and the heat insulation board.

25. The loop heat pipe module as claimed in claim 18, wherein the evaporator further comprises:
- a plurality of first partition units, disposed on the bottom board and within the side frame; and
- a plurality of second partition units, disposed on the top board and within the side frame,
- wherein a number of each of the at least one porous member, the at least one first channel, and the at least one second channel is more than one; the first partition units and the second partition units partition the porous members; the second partition units, the porous members and the bottom board define the first channels; while the first partition units, the porous members and the top board define the second channels.

26. The loop heat pipe module as claimed in claim 18, wherein the evaporator further has a compensation chamber, located between the porous member and the side frame, for containing the working fluid, wherein the fluid inlet of the evaporator communicates with the first channel through the compensation chamber.

27. The loop heat pipe module as claimed in claim 26, wherein the evaporator further comprises a support frame disposed among the top board, the bottom board, and the side frame, for partitioning the compensation chamber, the first channel, and the second channel.

28. The loop heat pipe module as claimed in claim 26, wherein the evaporator further has at least one filling opening, communicating with the compensation chamber.

29. The loop heat pipe module as claimed in claim 18, wherein the evaporator further has a fluid collecting chamber, located between the porous member and the side frame, wherein the fluid collecting chamber communicates with the fluid outlet of the evaporator and the second channel, the working fluid in the second channel is collected in the fluid collecting chamber, and is output through the fluid outlet of the evaporator.

30. The loop heat pipe module as claimed in claim 18, wherein the top board has at least one accommodation groove, for accommodating the porous member, the second channel is located between the top board and the porous member, and the first channel is located at one side of the porous member.

31. The loop heat pipe module as claimed in claim 18, wherein the bottom board has at least one accommodation groove, for accommodating the porous member, the first channel is located between the bottom board and the porous member, and the second channel is located at one side of the porous member.

32. The loop heat pipe module as claimed in claim 18, wherein each of the top board and the bottom board has at least one accommodation groove, for accommodating the porous member, the first channel is located between the bottom board and the porous member, and the second channel is located between the top board and the porous member.

33. The loop heat pipe module as claimed in claim 18, wherein the evaporator further comprises at least one support unit, connecting the top board and the bottom board.

34. The loop heat pipe module as claimed in claim 18, wherein the side frame and the top board are integrally formed, or the side frame and the bottom board are integrally formed.

35. The loop heat pipe module as claimed in claim 18, wherein the working fluid comprises water, acetone, ammonia, refrigerant, nano fluid, or a combination thereof.

36. The loop heat pipe module as claimed in claim 18, wherein the evaporator further has at least one filling opening, communicating with the first channel.

37. A heat generating apparatus, comprising:

a heat generating unit;

a heat dissipating unit; and a loop heat pipe module, comprising:

an evaporator, suitable for absorbing heat from the heat generating unit, the evaporator comprising:

a top board;

a bottom board;

a side frame, connecting the top board and the bottom board; and a plurality of porous members, disposed between the top board and the bottom board and within the side frame, extending in a first direction, and arranged in a second direction, wherein the first direction and the second direction are substantially perpendicular, and a part of the top board covering the porous members is a heat conducting portion connected with the heat generating unit, wherein the top board has:

at least one first channel, adjacent to the bottom board and the porous members, for containing a working fluid; and at least one second channel, adjacent to the top board and the porous members, for containing a working fluid, wherein the porous members are suitable for transferring the working fluid from the first channel to the second channel;

wherein the bottom board has:

at least one fluid inlet, communicating with the first channel; and at least one fluid outlet, communicating with the second channel;

a condenser, connected with the heat dissipating unit, suitable for containing the working fluid, and having at least one fluid inlet and at least one fluid outlet;

at least one first fluid transmission pipe, connecting the fluid outlet of the evaporator and the fluid inlet of the condenser; and at least one second fluid transmission pipe, connecting the fluid outlet of the condenser and the fluid inlet of the evaporator.

38. The heat generating apparatus as claimed in claim 37, wherein the porous member has:

a first surface, facing the bottom board, the first surface having at least one groove, so as to form the first channel; and a second surface, facing the top board, the second surface having at least one groove, so as to form the second channel.

39. The heat generating apparatus as claimed in claim 37, wherein the evaporator further comprises a heat insulation board, disposed between the top board and the bottom board, for partitioning the first channel and the second channel.

40. The heat generating apparatus as claimed in claim 39, wherein the heat insulation board has at least one opening, and the porous member passes through the opening.

41. The heat generating apparatus as claimed in claim 39, wherein edge of the heat insulation board has at least one chip, and a part of the porous member passes through the chip.

42. The heat generating apparatus as claimed in claim 39, wherein the heat insulation board has at least one cavity.

43. The heat generating apparatus as claimed in claim 39, wherein the evaporator further comprises:

at least one first support unit, connecting the bottom board and the heat insulation board; and at least one second support unit, connecting the top board and the heat insulation board.

44. The heat generating apparatus as claimed in claim 37, wherein the evaporator further comprises:

a plurality of first partition units, disposed on the bottom board and within the side frame; and a plurality of second partition units, disposed on the top board and within the side frame, wherein a number of each of the at least one porous member, the at least one first channel, and the at least one second channel is more than one; the first partition units and the second partition units partition the porous members; the second partition units, the porous members and the bottom board define the first channels; while the first partition units, the porous members and the top board define the second channels.

45. The heat generating apparatus as claimed in claim 37, wherein the evaporator further has a compensation chamber, located between the porous member and the side frame, for containing the working fluid, wherein the fluid inlet of the evaporator communicates with the first channel through the compensation chamber.

46. The heat generating apparatus as claimed in claim 45, wherein the evaporator further comprises a support frame disposed among the top board, the bottom board, and the side frame, for partitioning the compensation chamber, the first channel, and the second channel.

47. The heat generating apparatus as claimed in claim 45, wherein the evaporator further has at least one filling opening, communicating with the compensation chamber.

48. The heat generating apparatus as claimed in claim 37, wherein the evaporator further has a fluid collecting chamber, located between the porous member and the side frame, wherein the fluid collecting chamber communicates with the fluid outlet of the evaporator and the second channel, the working fluid in the second channel is collected in the fluid collecting chamber and is output through the fluid outlet of the evaporator.

49. The heat generating apparatus as claimed in claim 37, wherein the top board has at least one accommodation groove for accommodating the porous member, the second channel is located between the top board and the porous member, and the first channel is located at one side of the porous member.

50. The heat generating apparatus as claimed in claim 37, wherein the bottom board has at least one accommodation groove, for accommodating the porous member, the first channel is located between the bottom board and the porous member, and the second channel is located at one side of the porous member.

51. The heat generating apparatus as claimed in claim 37, wherein each of the top board and the bottom board has at least one accommodation groove, for accommodating the porous member, the first channel is located between the bottom board and the porous member, and the second channel is located between the top board and the porous member.

52. The heat generating apparatus as claimed in claim 37, wherein the evaporator further comprises at least one support unit, connecting the top board and the bottom board.

53. The heat generating apparatus as claimed in claim 37, wherein the side frame and the top board are integrally formed, or the side frame and the bottom board are integrally formed.

54. The heat generating apparatus as claimed in claim 37, wherein the working fluid comprises water, acetone, ammonia, refrigerant, nano fluid, or a combination thereof.

55. The heat generating apparatus as claimed in claim 37, wherein the evaporator further has at least one filling opening, communicating with the first channel.

56. The heat generating apparatus as claimed in claim 37, wherein the heat generating unit comprises:

a carrier, connected with the heat conducting portion of the top board; and at least one light emitting device, disposed on the carrier.

57. The heat generating apparatus as claimed in claim 56, wherein the light emitting device comprises a light emitting diode.

58. The heat generating apparatus as claimed in claim 37, wherein at least a part of the condenser extends in a curved shape along a surface of the heat dissipating unit.

59. The heat generating apparatus as claimed in claim 58, wherein the heat dissipating unit is a housing, and at least a part of the condenser extends in a curved shape along an inner surface and/or an outer surface of the housing.

* * * * *